(12) United States Patent
Hansen

(10) Patent No.: US 7,016,017 B2
(45) Date of Patent: Mar. 21, 2006

(54) LITHOGRAPHIC APPARATUS AND METHOD FOR OPTIMIZING AN ILLUMINATION SOURCE USING ISOFOCAL COMPENSATION

(75) Inventor: Steven George Hansen, Phoenix, AZ (US)

(73) Assignee: ASML Netherlands B.V., Veldhoven (NL)

( * ) Notice: Subject to any disclaimer, the term of this patent is extended or adjusted under 35 U.S.C. 154(b) by 102 days.

(21) Appl. No.: 10/716,439

(22) Filed: Nov. 20, 2003

(65) Prior Publication Data

US 2004/0158808 A1   Aug. 12, 2004

Related U.S. Application Data

(63) Continuation-in-part of application No. 10/361,831, filed on Feb. 11, 2003, now Pat. No. 6,839,125.

(51) Int. Cl.
   G03B 27/54   (2006.01)
   G03B 27/42   (2006.01)
   G03B 27/32   (2006.01)
   G06F 17/50   (2006.01)
   G03C 5/00    (2006.01)

(52) U.S. Cl. .................. 355/67; 355/53; 355/55; 355/77; 703/13; 430/30

(58) Field of Classification Search .............. 355/53, 355/55, 67, 71, 77; 430/30; 703/13, 22; 716/19, 21
   See application file for complete search history.

(56) References Cited

U.S. PATENT DOCUMENTS 5,305,054 A    4/1994   Suzuki et al.
5,523,193 A    6/1996   Nelson
5,680,588 A    10/1997  Gortych et al.
6,049,660 A    4/2000   Ahn et al.
6,452,662 B1   9/2002   Mulkens et al.
6,463,403 B1   10/2002  Burdorf et al.
6,466,304 B1   10/2002  Smith
6,784,975 B1 * 8/2004   Boettiger et al. ............. 355/53
2002/0035461 A1   3/2002   Chang et al.
2002/0045106 A1   4/2002   Baselmans et al.
2002/0062206 A1   5/2002   Liebchen
2002/0152452 A1   10/2002  Socha
2002/0167653 A1   11/2002  Mulkens et al.
2003/0073013 A1   4/2003   Hsu et al.
2003/0082463 A1   5/2003   Laidig et al.

(Continued)

OTHER PUBLICATIONS

Burkhardt et al., "Illuminator Design for the Printing of Regular Contact Patterns," *Microelectronic Engineering*, vol. 41, No. 42, 1998, pp. 91-96.

(Continued)

Primary Examiner—Alan Mathews
(74) Attorney, Agent, or Firm—Pillsbury Winthrop Shaw Pittman LLP

(57) ABSTRACT

A method for optimizing the illumination conditions of a lithographic apparatus by computer simulation using isofocal compensation, the lithographic apparatus including an illuminator, a projection system and a mask having at least one pattern to be printed on a substrate. This method includes defining a lithographic pattern to be printed on the substrate, selecting a simulation model, selecting a grid of source points in a pupil plane of the illuminator, calculating separate responses for individual source points, each of the responses representing a result of a single or series of simulations using the simulation model, calculating a metric representing variation of the separate responses for individual source points with defocus and adjusting an illumination arrangement based on analysis of the metric.

25 Claims, 21 Drawing Sheets

U.S. PATENT DOCUMENTS

2003/0093251 A1    5/2003   Chang
2003/0198872 A1*  10/2003   Yamazoe et al. ............ 430/5

OTHER PUBLICATIONS

Chen et al., "Practical Method for Full-Chip Optical Proximity Correction," *SPIE*, vol. 3051, 1997, pp. 790-803.

Chen et al., "Optical Proximity Correction for Intermediate-Pitch Features Using Sub-Resolution Scattering Bars," *Journal of Vacuum Science & Technology B*, vol. 15, No. 6, Nov./Dec. 1997, pp. 2426-2433.

Flagello et al., "Lithographic Lens Testing: Analysis of Measured Aerial Images, Interferometric Data and Photoresist Measurements," *SPIE Microlithography Seminar*, 1996.

Flagello et al., "Towards a Comprehensive Control of Full-Field Image Quality in Optical Photolithography," *SPIE Microlithography Seminar*, Mar. 1997.

Gau et al., "Strategy to Manipulate the Optical Proximity Effect by Post-Exposure Bake Processing," *SPIE*, vol. 3334, 1998, pp. 885-891.

Gau et al., "The Customized Illumination Aperture Filter for Low k1 Photolithography Process," *SPIE*, vol. 4000, Mar. 2000, pp. 271-282.

Hsia et al., "Customized Off-Axis Illumination Aperture Filtering for Sub-0.18 μm KrF Lithography," *SPIE*, vol. 3679, Mar. 1999, pp. 427-434.

Liu et al., "The Application of Alternating Phase-Shifting Masks to 140 nm Gate Patterning: Line Width Control Improvements and Design Optimization," *SPIE*, vol. 3236, 1998, pp. 328-337.

Smith et al., "Illumination Pupil Filtering Using Modified Quadrupole Apertures," *SPIE*, vol. 3334, 1998, pp. 384-394.

Suzuki et al., "Multilevel Imaging System Realizing $k_1$=0.3 Lithography," *SPIE*, vol. 3679, Mar. 1999, pp. 396-407.

Wong et al., "Level-Specific Lithography Optimization for 1-Gb DRAM," *IEEE Transactions on Semiconductor Manufacturing*, vol. 13, No. 1, Feb. 2000, pp. 76-87.

* cited by examiner

LITHOGRAPHIC APPARATUS AND METHOD FOR OPTIMIZING AN ILLUMINATION SOURCE USING ISOFOCAL COMPENSATION

This application is a Continuation-In-Part of U.S. patent application Ser. No. 10/361,831, filed on Feb. 11, 2003, now U.S. Pat. No. 6,839,125, entitled "Method for Optimizing an Illumination Source Using Full Resist Simulation and Process Window Metric", the content of which is incorporated herein in its entirety by reference.

BACKGROUND OF THE INVENTION

1. Field of the Invention

The present invention relates to a method for optimizing an illumination source of a lithographic apparatus. More specifically, the invention relates to a method for optimizing an illumination source using computer simulation.

2. Description of the Related Art

The term "patterning device" as here employed should be broadly interpreted as referring to a device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device. An example of such a patterning device is a mask. The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies on a substrate (silicon wafer) that has been coated with a layer of radiation sensitive material (resist). In general, a single wafer will contain a whole network of adjacent target portions that are successively irradiated via the projection system, one at a time. In current apparatuses, employing patterning by a mask on a mask table, a distinction can be made between two different types of machines. In one type of lithographic projection apparatus, each target portion is irradiated by exposing the entire mask pattern onto the target portion at once. Such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement and/or inspection of the imaged features. This array of procedures is used as a basis to pattern an individual layer of a device, e.g. an IC. Such a patterned layer may then undergo various processes such as etching, ion-implantation (doping), metallization, oxidation, chemical, mechanical polishing, etc., all intended to finish off an individual layer. If several layers are required, then the whole procedure, or a variant thereof, will have to be repeated for each new layer. It is important to ensure that the overlay juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatuses are described, for example, in U.S. Pat. Nos. 5,969,441 and 6,262,796.

Photolithography is widely recognized as one of the key steps in the manufacturing of integrated semiconductor circuits. At present, no alternative technology provides the desired pattern architecture with similar accuracy, speed, and economic productivity. However, as the dimensions of the ICs become smaller, photolithography is becoming one of the most, if not the most, critical gating factors for enabling miniature semiconductor device structures to be manufactured on a truly massive scale.

A theoretical estimate of the limits of pattern printing can be given by the Rayleigh criterion for resolution as shown in equation (1):

$$R = k_1 * \frac{\lambda}{NA} \quad (1)$$

where $\lambda$ is the wavelength of the radiation used, NA is the numerical aperture of the lens in the projection system and $k_1$ is a process dependent adjustment factor.

It follows from equation (1) that the resolution can be improved in three ways: by shortening the exposure wavelength $\lambda$, by increasing the numerical aperture NA or by decreasing the value of $k_1$. All of these strategies have been pursued simultaneously in the past and are expected to continue in the future.

The performance of the lithographic apparatus and its limitation may also be explained and characterized with the Depth Of Focus (DOF), which is generally viewed as one of the most critical factors in determining the resolution of the lithographic projection apparatus. The DOF, defined in equation (2), is defined as the distance along the optical axis over which the image of the pattern is adequately sharp.

$$DOF = +/- k_2 * \frac{\lambda}{NA^2} \quad (2)$$

where $k_2$ is an empirical constant.

Additional important responses/measures that provide more insight into the real difficulties associated with photolithography at the resolution limit comprise the Exposure Latitude (EL), the Dense Isolated Bias (DIB), and the Mask Error Enhancement Factor (MEEF). The Exposure Latitude describes the percentage dose range where the printed pattern's critical dimension (CD) is acceptable, typically 10%. It is used along with the DOF to determine the process window, i.e. the regions of focus and exposure that keep the final resist profile within prescribed specifications. As for the DIB, it is a measure of the size difference between similar features, depending on the pattern density. Finally, the MEEF describes how reticle CD errors are transmitted into wafer CD errors.

As the semiconductor industry moves into the deep submicron regime, the resolution limit of currently available lithographic techniques is being reached due to a decrease in the depth of focus, difficulty in the design of lenses and complexities in the lens fabrication technology. In order to address this issue, there have been continued endeavors to develop resolution enhancement techniques.

Historically, the resolution limit of a lithographic projection tool was optimized by the control of the relative size of the illumination system numerical aperture (NA). Control of this NA with respect to the projection system's objective lens NA allows for modification of spatial coherence at the mask plane, commonly referred to as partial coherence $\sigma$. This is accomplished through specification of the condenser lens pupil in a Kohler illumination system. Essentially, this allows for manipulation of the optical processing of diffraction information. Optimization of the partial coherence of a projection imaging system is conventionally accomplished using full circular illuminator apertures. By controlling the distribution of diffraction information in the objective lens with the illuminator pupil size, maximum image modulation can be obtained. Illumination systems can be further refined by considering variations to full circular illumination apertures. A system where illumination is obliquely incident on the mask at an angle so that the zero-th and first diffraction orders are distributed on alternative sides of the optical axis may allow for improvements. Such an approach is generally referred to as off-axis illumination.

Off-axis illumination improves resolution by illuminating the mask with radiation that is at an angle to the optical axis of the lens. The incidence of the radiation on the mask, which acts as a diffraction grating, improves the contrast of the image by transmitting more of the diffracted orders through the lens. Off-axis illumination techniques used with conventional masks produce resolution enhancement effects similar to resolution enhancement effects obtained with phase shifting masks.

Various other enhancement techniques that have been developed to increase the resolution and the DOF include optical proximity correction (OPC) of optical proximity errors (OPE), phase shifting masks (PSM), and sub-resolution assist features (SRAF). Each technique may be used alone, or in combination with other techniques to enhance the resolution of the lithographic projection tool.

One approach to generate off-axis illumination is to incorporate a metal aperture plate filter into the fly eye lens assembly of the projection system illuminator providing oblique illumination. A pattern on such a metal plate would have four symmetrically arranged openings (zones) with sizing and spacing set to allow diffraction order overlap for specific geometry sizing and duty ratio on the photomask. Such an approach results in a significant loss in intensity available to the mask, lowering throughput and making the approach less than desirable. Additionally, the four circular openings need to be designed specifically for certain mask geometry and pitch and do not improve the performance of other geometry sizes and spacings. The previous work in this area describes such a method using either two or four openings in the aperture plate. See, for example, EP 0 500 393, U.S. Pat. Nos. 5,305,054, 5,673,103, 5,638,211, EP 0 496 891 and EP 0 486 316.

Another approach to off-axis illumination using the four-zone configuration, which is disclosed in U.S. Pat. No. 6,452,662, incorporated herein by reference in its entirety, is to divide the illumination field of the projection system into beams that can be shaped to distribute off-axis illumination to the photomask. By incorporating the ability to shape off-axis illumination, throughput and flexibility of the exposure source is maintained. Additionally, this approach allows for illumination that combines off-axis and on-axis (conventional) characteristics. By doing so, the improvement to dense features that are targeted with off-axis illumination is less significant than straight off-axis illumination. The performance of less dense features, however, is more optimal because of the more preferred on-axis illumination for these features. The result is a reduction in the optical proximity effect between dense and isolated features. Optimization is less dependent on feature geometry and more universal illumination conditions can be selected.

Referring to FIGS. 2–5, currently available illumination intensity distributions or arrangements include small, or low, sigma (FIG. 2), annular (FIG. 3), quadrupole (FIG. 4), and quasar (FIG. 5), with the illuminated areas (hereinafter referred to as the aperture(s)) shown in cross section. The annular, quadrupole and quasar illumination techniques of FIGS. 3–5 are examples of off-axis illumination schemes.

Small sigma illumination is incident on the mask with approximately zero illumination angle (i.e. almost perpendicular to the mask) and produces good results with phase shifting masks to improve resolution and increase the depth of focus. Annular illumination is incident on the mask at angles that are circularly symmetrical and improves resolution and increases depth of focus while being less pattern dependent than other illumination schemes. Quadrupole and quasar illumination are incident on the mask with four main angles and provide improved resolution and increased depth of focus while being strongly pattern dependent.

Referring to FIGS. 6 and 7, two illumination systems L are schematically illustrated. The systems illustrated in FIGS. 6 and 7 include light collecting/collimating optics 10; an axicon/zoom module 12; and light integrating and projecting optics 14. The illumination systems IL define an optical axis 16, a pupil plane 18, and a mask plane 20. The axicon/zoom module 12 comprises a pair of axicons 22, one concave and one convex, whose separation can be varied. The module 12 also comprises a zoom lens 24.

For the case of conical axicons, some examples of the illumination intensity distributions achievable at the pupil plane 18 are shown in FIG. 8. The spot size can be varied between states A and B by changing the zoom lens position. Similarly, the annularity can be changed between states A and C by varying the axicon opening (separation between the axicons).

To improve the illumination homogeneity, an optical integrator 26 is used. In FIG. 6 the optical integrator takes the form of a light pipe 26, such as a glass, calcium fluoride or quartz rod. A coupler 28 couples the illumination at the pupil plane 18 into the rod 26, and rod exit imaging optics 30 are also provided. In FIG. 7 a fly's eye element 32 acts as the integrator. The fly's eye element 32 is a composite lens comprising an array or honeycomb of small lenses. Further, objective lenses 34 and 36 complete the projection optics.

It results from the foregoing discussion that numerous options are available to the process engineer for increasing the resolution of the lithographic projection apparatus and for maximizing the process window. Yet, given the cost and time to perform experiments in a semiconductor fabrication facility (fab), the approach that would consist of testing these options across the board to develop a robust process is simply unrealistic. As the product cycle times in the semiconductor field are relatively short, severe limitations are put on the amount of time that can be spent on research and development for each new product line or manufacturing process.

In response to this concern, there has been a growing interest in photolithographic simulations within the industry. Given the fact that a simulation experiment for optimizing the optical proximity correction features for a new mask test may only take one day, instead of months with experiments on wafers, simulations are viewed today as a useful tool to aid in the development and optimization of lithographic apparatuses.

It follows that simulations can be extremely helpful as a development tool, by quickly evaluating options, optimizing processes, and saving time and money by reducing the number of required experiments. Simulations can also aid in the research context to understand many physical phenomena that occur when pushing the limits of resolution to achieve feature size in the order of or below the wavelength of the lithographic apparatus. Finally, simulations can be a tremendous tool to extend the optical lithography to the sub-150 nm regime and to prolong the lifetimes of million dollar steppers and billion dollar fabs.

SUMMARY OF THE INVENTION

The present invention relates to a method for optimizing the illumination conditions of a lithographic projection apparatus by computer simulation using isofocal compensation. The present invention provides optimization of illumination conditions of various responses of a lithographic projection apparatus, including, for example, the process window (exposure/dose latitude versus depth of focus), side lobe printing and mask error enhancement factor.

In one aspect of the present invention, there is provided a method for optimizing the illumination conditions of a lithographic apparatus by computer simulation using isofocal compensation, wherein the lithographic apparatus comprises an illuminator configured to provide an illumination arrangement, a projection system and a mask having at least one pattern to be printed on a substrate, the method including defining a lithographic pattern to be printed on a substrate; selecting a simulation model; selecting a grid of source points in a pupil plane of the illuminator; calculating separate responses for individual source points, each of the responses representing a result of a single or series of simulations using the simulation model; calculating a metric representing variation of the separate responses for individual source points with defocus; and adjusting an illumination based on analysis of the metric.

In another aspect of the present invention, there is provided a lithographic projection apparatus comprising: an illumination system to provide a projection beam of radiation; a support structure to support patterning structure which can be used to pattern the projection beam according to a desired pattern; a substrate table to hold a substrate; a projection system to project the patterned beam onto a target portion of the substrate; a processor to define a lithographic pattern to be printed on the substrate, to select a grid of source points in a pupil plane of the illumination system, to calculate separate responses for individual source points, each of the responses representing a result of a single or series of simulations using a simulation model, to calculate a metric representing variation of the separate responses for individual source points with defocus, and to calculate an optimized illumination arrangement based on analysis of the metric; and a selectably variable beam controller that is adapted to modify a cross-sectional intensity distribution in the projection beam exiting the illumination system in accordance with the optimized illumination arrangement calculated by the processor.

According to another aspect of the present invention, there is provided a machine readable medium encoded with machine executable instructions for optimizing an illumination condition of an illuminator using isofocal compensation according to a method comprising: defining a lithographic pattern to be printed on a substrate; selecting a simulation model; selecting a grid of source points in a pupil plane of the illuminator; calculating separate responses for individual source points, each of the responses representing a result of a single or series of simulations using the simulation model; calculating a metric representing variation of the separate responses for individual source points with defocus; and adjusting an illumination arrangement based on analysis of the metric.

According to yet another aspect of the invention, there is provided a device manufacturing method comprising: providing a mask; and projecting a patterned beam of radiation onto a target portion of a layer of radiation-sensitive material on a substrate, wherein, prior to impinging the mask, a cross-sectional intensity distribution in the projection beam is optimized using a method as described above.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. It should be appreciated that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of examples only, with reference to the accompanying schematic drawings in which.

DETAILED DESCRIPTION

Figure 1:
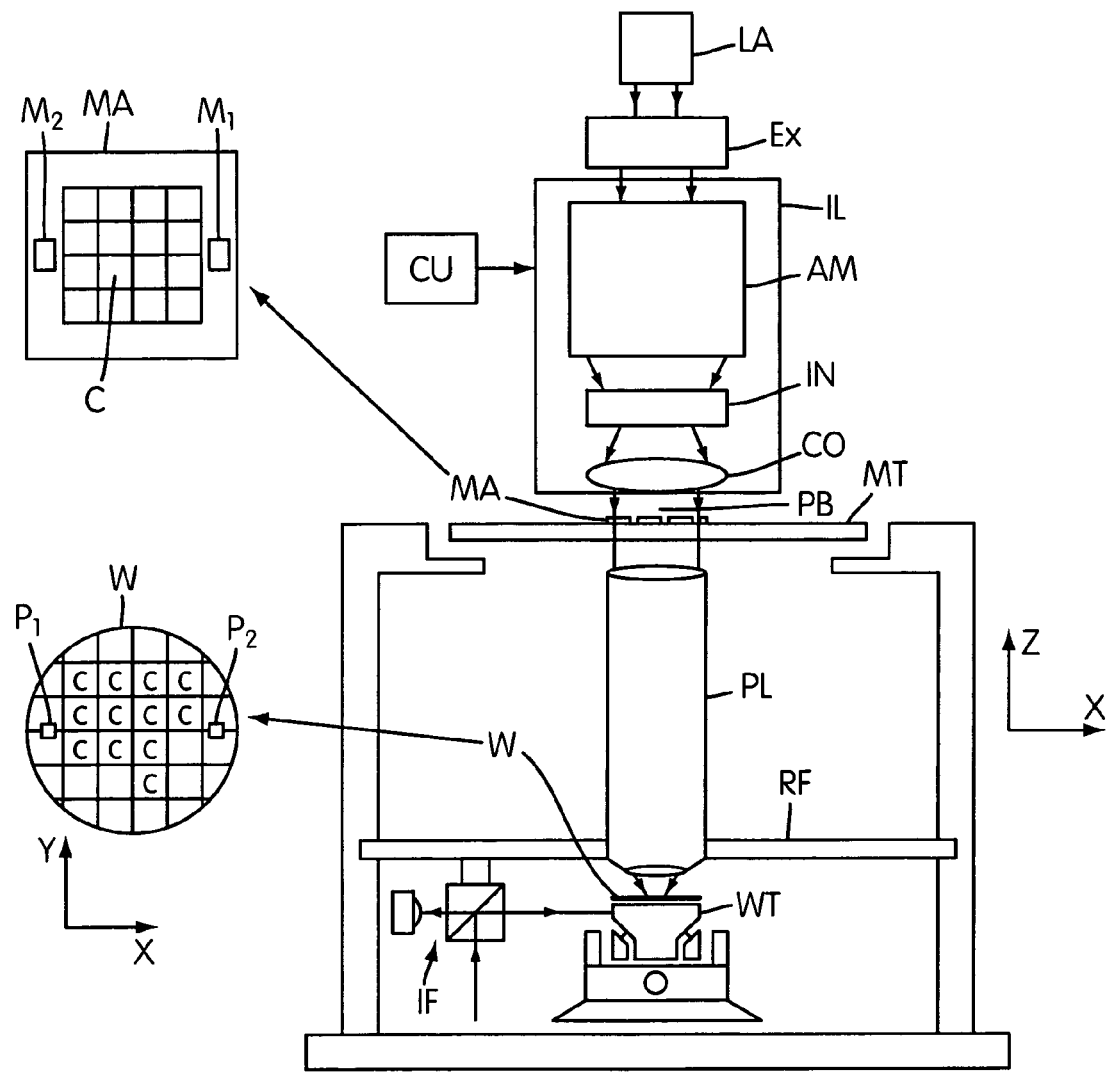
FIG. 1 is a schematic illustration of a photolithographic projection apparatus.
Figure 2:
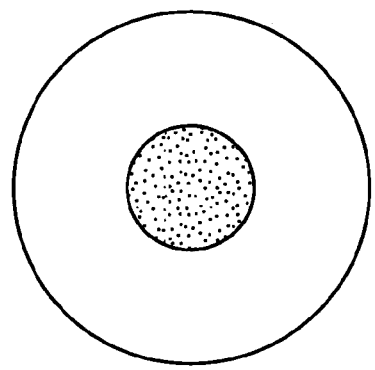
FIG. 2 is a schematic illustration of a small, or low, sigma illumination arrangement.
Figure 3:
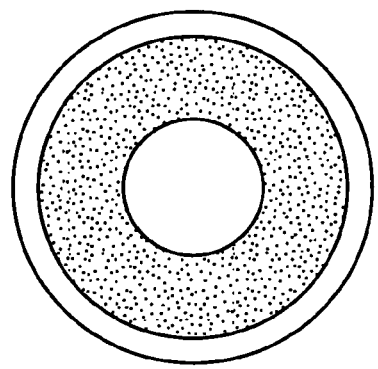
FIG. 3 is a schematic illustration of an annular off-axis illumination arrangement.
Figure 4:
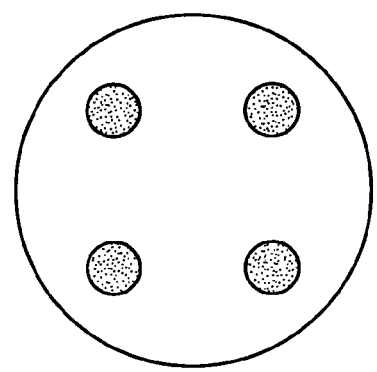
FIG. 4 is a schematic illustration of an off-axis quadrupole illumination arrangement.
Figure 5:
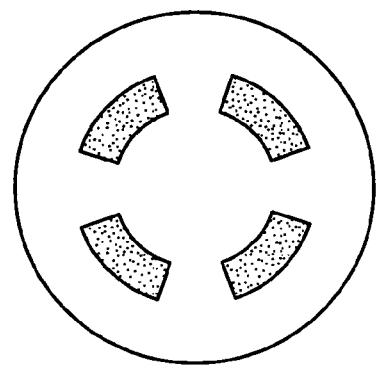
FIG. 5 is a schematic illustration if an off-axis quasar illumination arrangement.
Figure 6:
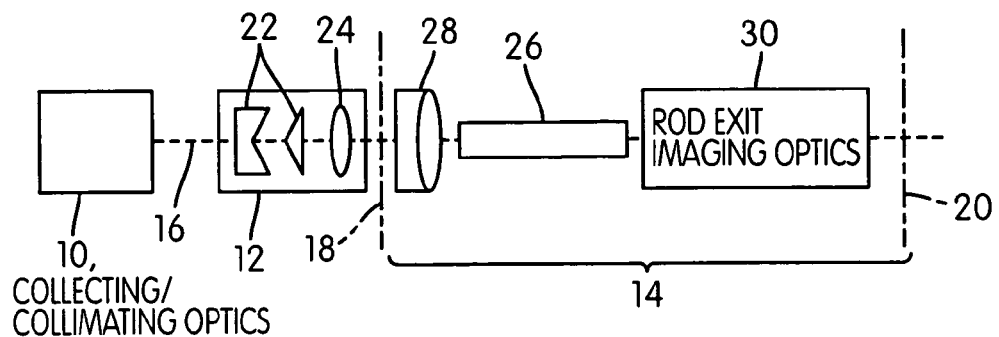
FIG. 6 is a schematic illustration of a known illumination system.

FIG. 1 schematically depicts a lithographic projection apparatus 1 according to an embodiment of the invention. The apparatus includes a radiation system Ex, IL constructed and arranged to supply a projection beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object (mask) table MT provided with a mask holder constructed and arranged to hold a mask MA (e.g. a reticle), and connected to a first positioning device PM to accurately position the mask with respect to a projection system or lens PL; a second object (substrate) table WT provided with a substrate holder constructed and arranged to hold a substrate W (e.g. a resist-coated silicon wafer), and connected to a second positioning device PW to accurately position the substrate with respect to the projection system or lens PL. The projection system or lens PL (e.g. a quartz and/or $CaF_2$ lens system or a refractive or catadioptric system, a mirror group or an array of field deflectors) is constructed and arranged to image an irradiated portion of the mask MA onto a target portion C (e.g. comprising one or more dies) of the substrate W. The projection system PL is supported on a reference frame RF.

As here depicted, the apparatus is of a transmissive type (i.e. has a transmissive mask). However, in general, it may also be of a reflective type, (e.g. with a reflective mask). Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces a beam PB of radiation. The beam PB is fed into an illumination system (illuminator) IL, either directly or after having traversed a conditioner, such as a beam expander Ex, for example. The illuminator IL may comprise a selectably variable beam controller or an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

Figure 14:
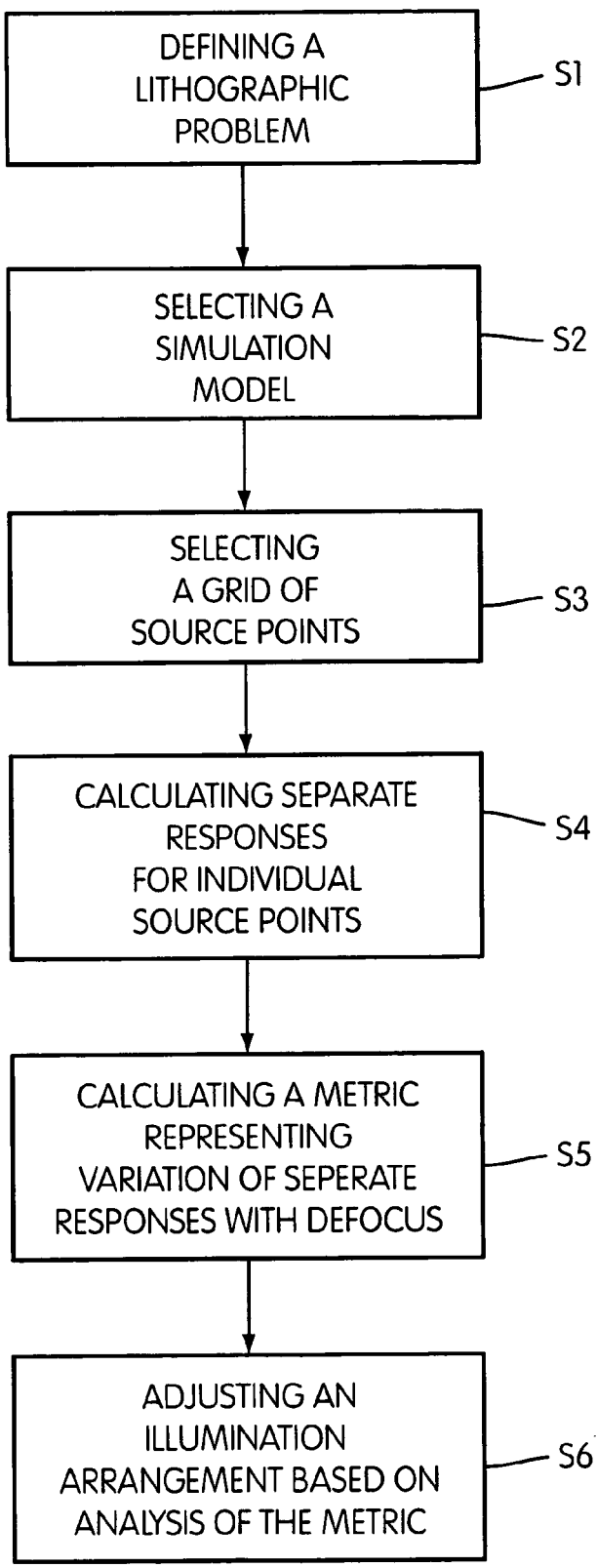
FIG. 14 represents a flowchart illustrating a method for optimizing the illumination using isofocal compensation in accordance with an embodiment of the invention.

Still referring to FIG. 1, the projection apparatus also includes a control unit CU which may be programmed to execute the method illustrated in FIG. 14 and may be configured to control the different components of the lithographic apparatus. In one embodiment of the invention, control unit CU may include a processor that is configured to control the adjusting device AM and to modify the cross-sectional intensity distribution in the projection beam exiting the illuminator IL.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios. In particular, the present invention encompasses embodiments wherein the radiation system Ex, IL is adapted to supply a projection beam of radiation having a wavelength of less than about 250 nm, such as with wavelengths of 248 nm, 193 nm, 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g. the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 9:
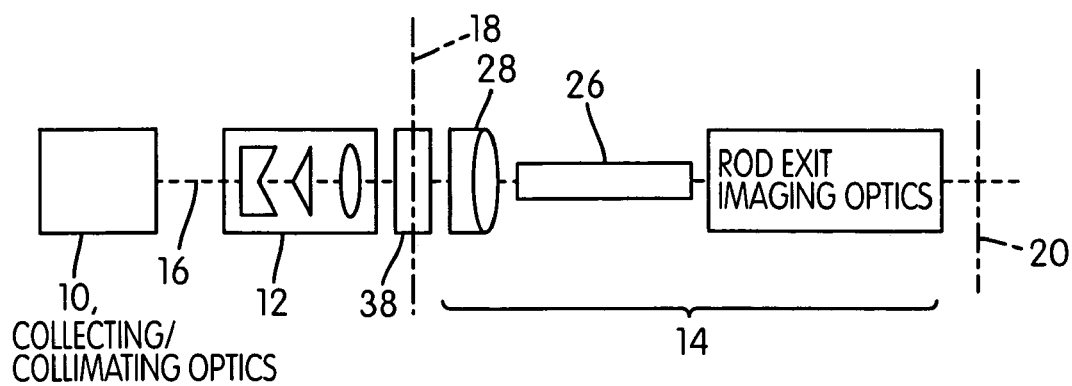
FIG. 9 is a schematic illustration of an illumination system for use in the invention.

Referring to FIG. 9, the illumination system IL includes light collecting/collimating optics 10; an axicon/zoom module 12; a multipole mode generating element 38; and light integrating and projecting optics 14. The components lie along optical axis 16 and are used to illuminate the mask MA located at a mask plane 20 which then produces an exposure pattern in resist on the wafer W via the projection system or lens PL. The illumination system IL illustrated in FIG. 9 includes a quartz rod light integrator 26. The optical axis 16 shown in FIG. 9 can of course be folded to produce a more compact illumination system.

Figure 10A:
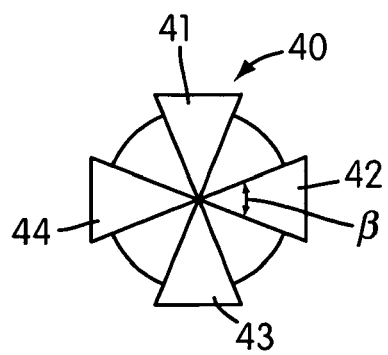
FIG. 10a is a schematic illustration of a multipole mode generating element of the illumination system of FIG. 9.
Figure 10B:
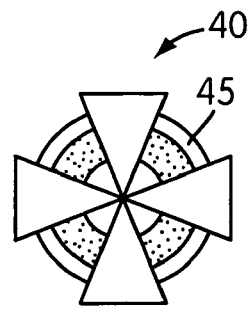
FIG. 10b is a schematic illustration of a multipole mode generating element according to an another exemplary embodiment of the invention.
Figure 11:
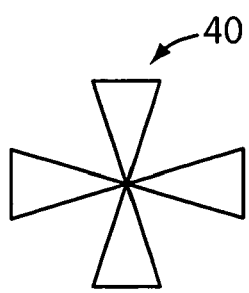
FIG. 11 is a schematic illustration of a multipole mode generating element according to another exemplary embodiment of the invention.

An exemplary embodiment of the multipole mode generating element 38 is shown in FIG. 10a. The element 38 has four triangular blades 41, 42, 43, 44 insertable into the beam path at the pupil plane 18 and which form a Maltese cross 40, which is also referred to herein as a Maltese aperture blade (MAB). Each blade has an apex angle β. FIG. 10b shows the illumination intensity distribution resulting from the combination of an annular illumination mode produced by the axicon/zoom module 12 and the MAB 40. The distribution has four light beams or poles 45. This embodiment enables continuously variable quadrupole illumination modes to be produced. The radial position of each pole 45 can be varied by adjusting the axicon optics 22, the radial width of each pole can be varied by adjusting the zoom lens 24, and the tangential pole width can be changed by inserting another set of blades having a different apex angle β1, such as Maltese cross 40 shown in FIG. 11. By removing the blades altogether, the illumination system can be used for conventional and/or annular modes, again with continuous variation.

Interposing blades of a different apex angle permits the tangential pole width to be changed in discrete steps. According to another embodiment of the invention, the tangential pole width can be continuously varied by each arm of the Maltese cross comprising a stack of n blades, rotatable with respect to each other about the optical axis of the system where their vertices lie.

According to a further embodiment, just two blades are used as the multipole mode generating element 38 in an optical system which includes a light pipe, such as a rectangular quartz rod 26, as shown in the illumination system of FIG. 9. One of the blades is oriented parallel to the short side of the rectangular cross-section of the light pipe 26 and the other blade parallel to the long side. Due to the multiple reflections in the pipe 26, the resulting illumination mode is a mixture of annular and quadrupole. The two-blade system can produce an illumination mode including a quadruple component with lower energy-loss than the Maltese cross arrangement, as there are fewer blades obstructing the light beam. In one example the blades are triangular and are like two perpendicular arms of a Maltese cross, e.g. blades 41 and 42 shown in FIG. 10a. One or both of the blades in this embodiment can be a composite blade comprising a stack of smaller rotatable blades as described above.

Typically the blades are positioned along directions corresponding to orthogonal lines on the mask MA, so that the light poles 45 are located in each quadrant with centers 45° from the orthogonal lines. This orientation can produce optimal projection of the lines, particularly for dense structures, such as for DRAM-like structures. The orthogonal lines are generally referred to as horizontal and vertical. As pattern features decrease in size, light poles located in each quadrant with centers 90° from the orthogonal lines become more preferred. The optimal sigma for quadrupole illumination can be estimated from the formula: $\sigma=\lambda/(\sqrt{2}\ \text{NA·pitch})$, and for dipole and 45° rotated quadrupole from: $\sigma=\lambda/(2\ \text{NA·pitch})$ A further variation on the above embodiments using blades is to make all the blades rotatable about the optical axis 16 of the illumination system so that the position of the poles can be rotated.

Figure 12:
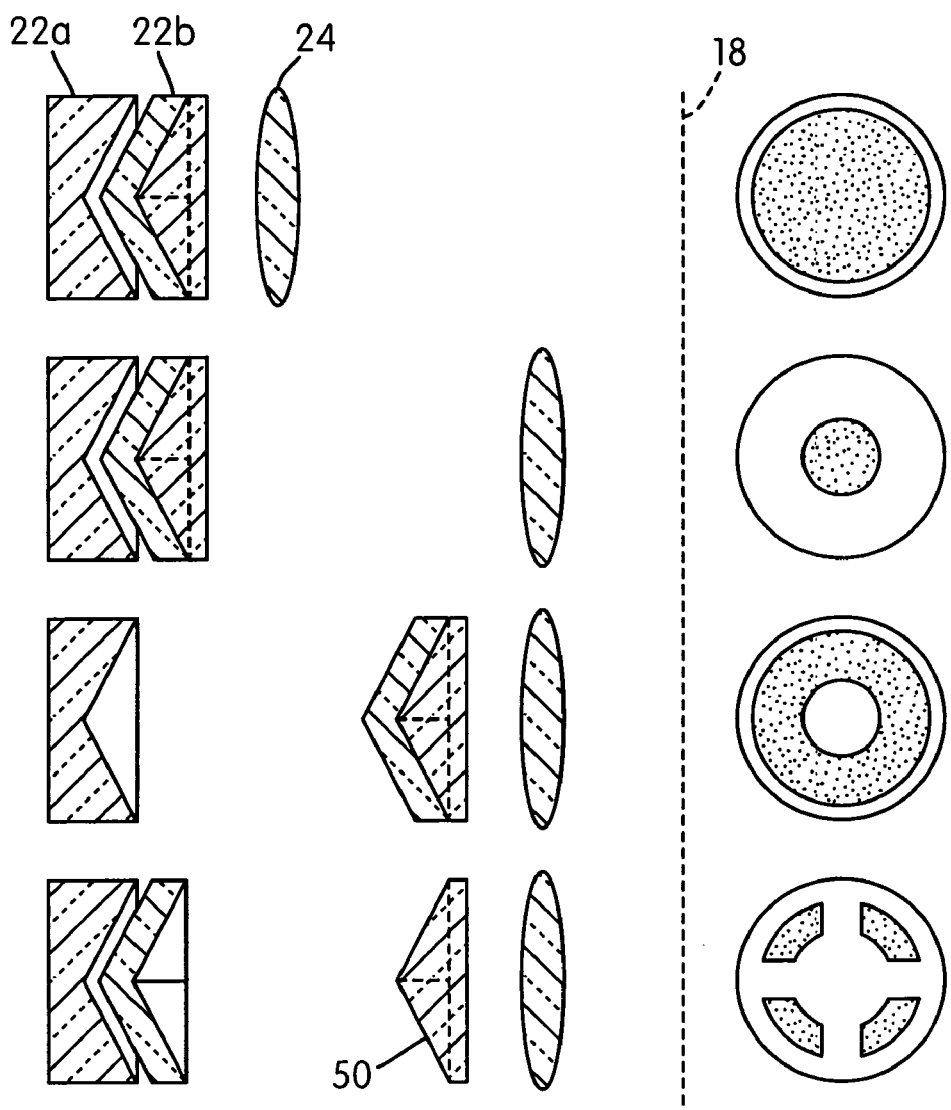
FIG. 12 is a schematic cross section illustration of an illumination system for use in the invention and the resulting illumination arrangements obtainable therewith.

Referring to FIG. 12, another exemplary embodiment of the present invention includes the axicon/zoom module with a pyramidal prism 50 as the multipole mode generating element. This also enables conventional, annular and quadrupole illumination to be produced with continuous variations of the modes. FIG. 12 shows the optical components of an axicon/zoom module. The right hand column in FIG. 12 shows the illumination intensity distributions at the pupil plane 18 for various positions of the axicon pair 22a, 22b and zoom lens 24. The axicon pair 22 comprises a pair of elements having conical surfaces, one concave 22a, one convex 22b, to produce circular and annular illumination patterns. The fourth row shows the effect of separating the pyramid-shaped prism 50 from convex element 22b. The side of the convex element 22b facing the pyramid 50 is concave pyramidal for receiving the pyramid 50. The convex element 22b and pyramid 50 comprise a second axicon also known as a pyramidal axicon or pyramidon. The pyramid-shaped prism 50 has a four-sided base, which consequently produces quadrupole mode illumination patterns, such as the four spots illustrated at the bottom in the right hand column in FIG. 12.

The axicon/zoom module of FIG. 12 allows the illumination mode to be varied continuously from conventional to annular or quadrupole. The zoom lens 24 sets the spot size or partial coherence factor, the axicon pair 22 determines the annularity, and the pyramid 50 determines the quadrupolarity. In addition, since light flux is redistributed rather than blocked, there is virtually no light loss, so that a high throughout can be maintained.

The method of the present invention allows for optimization of the illumination conditions of the lithographic apparatus by selecting an appropriate arrangement of the illuminator by computer simulation. In the present invention, selection of the illuminator arrangement is done so that the lithographic process obtained is substantially isofocal over a predetermined range of defocus. In one embodiment of the invention, isofocal compensation is achieved with a method comprising the steps of defining a lithographic pattern to be printed on a substrate; selecting a simulation model; selecting a grid of source points in a pupil plane of the illuminator; calculating separate responses for individual source points, each of the responses representing a result of a single or series of simulations using the simulation model; calculating a metric representing variation of the separate responses for individual source points with defocus; and adjusting an illumination arrangement based on analysis of the metric.

Figure 13:
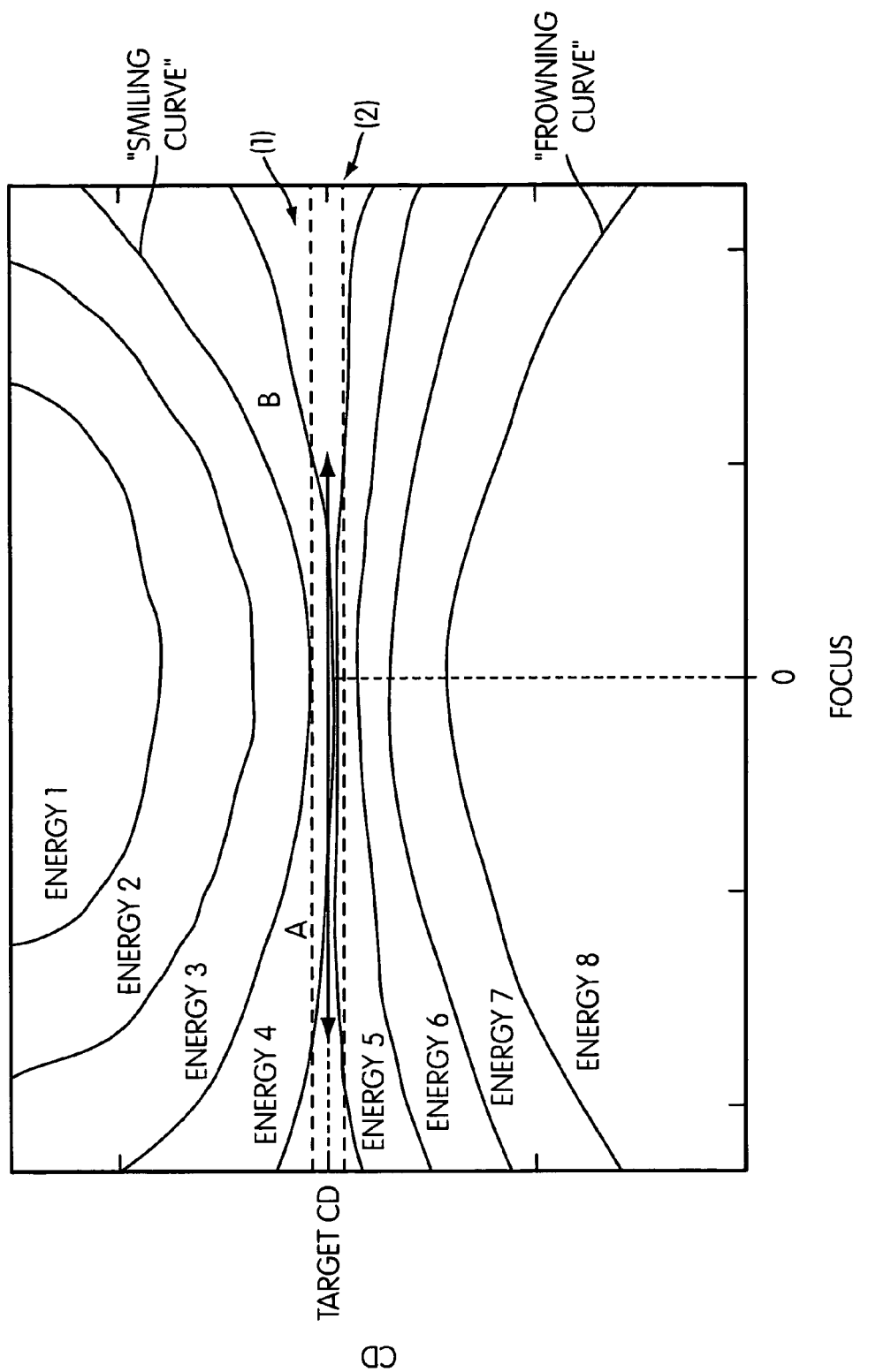
FIG. 13 is a Bossung plot showing multiple CD vs. defocus curves, each curve at a different exposure.

In the method of the present invention, optimization of the illumination conditions is based on the fact that for many lithographic problems two opposite failure mechanisms in defocus exist. This principle is illustrated in FIG. 13, which represents a focus exposure matrix at fixed CD on the mask. This matrix, also called a Bossung plot, captures important lithographic parameters, and more specifically the variation of the CD as a function of focus for different exposure energies.

In FIG. 13, the lithographic useful dose and focus are defined by their ability to equally print structures that are nominally equal on the mask. In this graph, the lithographic process will be deemed robust if a large variation in focus and dose minimally impacts the target CD. Practically, this requires to keep the printed CD within a range of acceptable CDs. This range is schematically illustrated in FIG. 13 by the CDs comprised between dotted lines (1) and (2). Ideally, this robust process will be portrayed by the "isofocal" segment AB in the Bossung plot.

As can be seen in this graph, errors in focus and dose can lead to two opposite effects, which can trigger a failure mechanism for the lithographic process. The first effect is characterized by a CD increase outside the range of acceptable CDs while the second effect is characterized by a CD decrease outside this range.

Therefore, in order to render the lithographic process substantially isofocal, optimization of the lithographic process is performed in an embodiment of the invention by compensating one effect with another. More particularly, this is achieved, in an embodiment of the invention, by balancing the regions in the illuminator producing high CDs with the regions producing small CDs. By doing so, CD variations within the process window are drastically decreased, a substantially isofocal process over the predetermined range of focus may be obtained, and the focus range (DOF) over which the CDs remain acceptable is augmented.

More specifically, the method for optimizing the illumination conditions of a lithographic apparatus provides in one embodiment of the invention a new metric that accounts for the variations of the target CD with defocus. The metric in this embodiment calculates, for each source point situated in the illuminator, the CD at a given defocus and compares this result with the CD obtained at the best focus. This computation is subsequently reiterated for all the source points located in the illuminator. Adjustment of the illumination conditions is then performed on the basis of the comparison of the results obtained for each source point. More specifically, adjustment of the illumination conditions is performed by selecting an illumination arrangement combining areas of the illuminator producing, in the defocused condition, high CDs on the substrate with areas of the illuminator producing small CDs on the substrate.

The method of the present invention allows for calculation of the CDs of the pattern and more generally of the response for each source point by computer simulations.

In one embodiment of the invention an aerial image model may be used to calculate the separate responses. In this embodiment, the incident light energy distribution onto the photoresist surface is simulated. Simulation of the aerial image may be done with the aid of commercially available simulators such as Prolith™ or the like. The models used in such a case are well known and are based on the Fourier optics either in its scalar or vector form. In this embodiment, the characteristics of the different elements of the photographic apparatus, like the numerical aperture NA or specific patterns, may be entered as input parameters for the simulation.

Also, in this embodiment, the calculated image may be evaluated versus some predetermined criteria to judge whether the image has enough contrast to successfully print the desired feature in photoresist on the wafer. The aerial image can be analyzed, through a focus range, to provide estimates of the exposure latitude and DOF and the procedure can be performed iteratively to arrive at the best optical conditions. Practically, the quality of the aerial image may be determined by using a contrast or normalized aerial image log-slope (NILS) metric (normalized to the feature size). This value corresponds to the slope of the image intensity (or aerial image).

In this embodiment, the response studied for each source point may be the variation with defocus of the intensity threshold of the aerial image giving the target CD. Alternatively, in another embodiment of the invention, the response studied may be the variation of the CD with defocus at the fixed intensity threshold (i.e., at the intensity threshold of the aerial image giving the target CD).

In another embodiment of the present invention, simulation of the responses for each source point can be performed using a full resist calculation. In this approach, the effect of the image receiver, i.e. the photoresist, and more specifically the effects due to the interaction of the electromagnetic field with the photoresist will be accounted for in the computation. The full resist process simulation may also take into account the steps of photoresist baking and photoresist developing, thereby considering the effects due to non-zero diffusion of active physical species or finite dissolution contrast.

In this model, input parameters may comprise dissolution parameters ($R_{min}$, $R_{max}$; Mack4 n and $M_{th}$; notch model n, $n_{notch}$, and $M_{th}$), bake parameters (diffusion length, quencher concentration (Q), amplification rate constant [$K_{amp}$]), and optical parameters (Dill B). Calculation of the separate responses using this approach may be performed following the method described in the parent application Ser. No. 10/361,831, incorporated herein in its entirety by reference.

Referring to FIG. 14, an exemplary embodiment of a method for optimizing the illumination conditions of a lithographic apparatus using isofocal compensation will now be explained.

The method begins in step (S1) where a lithographic problem is defined. The lithographic problem represents a particular pattern to be printed onto a substrate. This pattern, which is used to optimize the parameters of the lithographic apparatus and to choose a proper configuration of the illumination system, is preferably representative of an aggressive configuration included in the mask layout. This can be, for example, features with 1:1 to 1:20 line to space duty ratio or a pattern simultaneously grouping dense features and isolated features.

The method then proceeds to step (S2) where the simulation model that calculates the profile of the pattern is selected.

The simulation model may include in one embodiment of the invention an aerial image model. In that case, the distribution of the incident light energy distribution onto the photoresist will be calculated. Calculation of the aerial image may be done either in the scalar or vector form of the Fourier optics. Practically, this simulation may be carried out with the aid of a commercially available simulator such as Prolith™, Solid-C™ or the like.

In this specific embodiment, key relevant parameters to run aerial image simulations may comprise the distance from the focal plane of the Gaussian image plane, meaning the distance to the plane where the best plane of focus exists, as determined by the geometrical ray optics, or the center wavelength of the quasi-monochromatic light source. These parameters may also include a measure of degree of spatial partial coherence of the illumination system, the numerical aperture of the lens system illuminating the semiconductor substrates, the aberrations of the optical system and a full description of the spatial transmission function representing the optical mask.

Alternatively, the simulation model may be based in another embodiment of the invention on a full resist calculation. In such a case, the simulation may take into account the scattering of the electromagnetic field caused by the non-homogeneity of the photoresist, a non-planar topography or the vector effects. The resist model should also preferably take into account the photoresist exposure, the photoresist baking and the photoresist developing. Calculation of the resist profile after exposure and development may be carried out following the method claimed in the parent application Ser. No. 10/361,831.

Naturally, in the event that a full resist calculation is used, essential parameters to run the simulation will be defined and loaded in the simulator. These parameters may comprise, besides the set of parameters used in the aerial image simulation, the dissolution and the bake parameters.

It should be understood that selection of the simulation model, in step S2, is by no means limited to an aerial image model or a full resist calculation model. Additional models like a Lumped Parameter Model and a Variable Threshold Resist model may also be used in other embodiments of the invention. In all these embodiments, the model is selected because it has been matched to experimental data.

As one of ordinary skill in the art would acknowledge, it should also be understood that the use of simulation in step (S2) is not limited to the calculation of the resist profile and that simulations may be carried out to extract additional/complementary responses like process latitude, dense/isolated feature biases, side lobe printing and sensitivity to mask errors.

After defining the resist model and the key relevant parameters, the method then proceeds to step (S3) where a grid of source points, representing a discretization of the source beam, is defined in the pupil plane of the illuminator.

Figure 7:
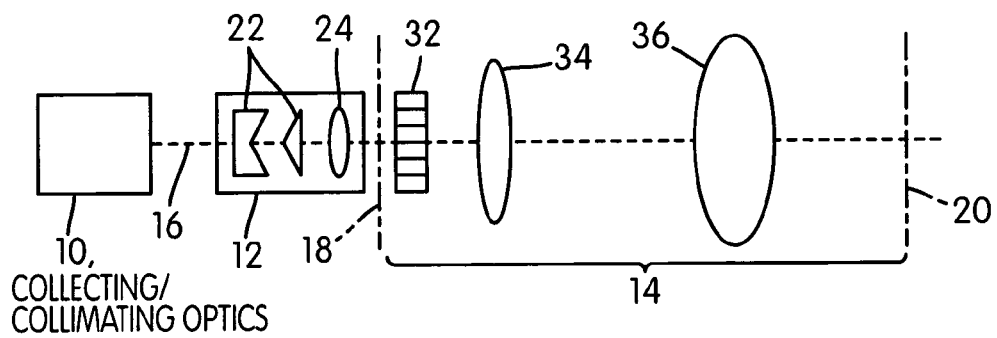
FIG. 7 is a schematic illustration of another known illumination system.
Figure 8:
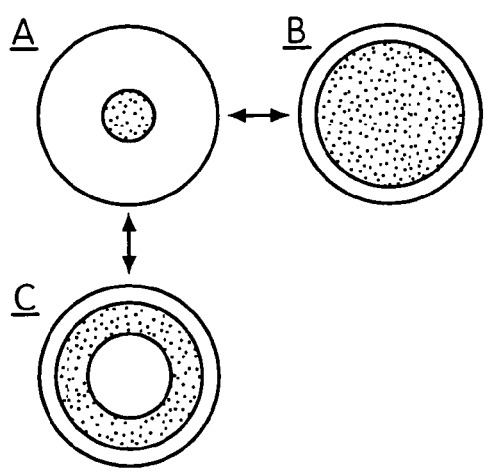
FIG. 8 is a schematic illustration of illumination arrangements obtainable with the illumination systems of FIGS. 6 and 7.

More specifically, illumination files, each representing an individual grid point, are generated and loaded in the simulation software. The light source points contained in the files form a light source point grid that spatially covers the entire cross-section of the illuminator at the pupil plane 18 of the illumination system shown in FIGS. 7–9. The physical location of each light source point relative to the full illuminator aperture is set in the individual source points file and can be varied depending on the degree of accuracy desired. A small spacing between each light source point will provide more detailed information on the source response but may notably increase the calculation time. Conversely, a large spacing between each light source point may provide less accurate information on the source response but will significantly decrease the calculation time. In one embodiment of the invention, the spacing of the grid relative to the full illuminator aperture is approximately 0.1. In other embodiments, the grid spacing is approximately 0.01 to 0.2.

It should be understood that the grid of source points may be defined differently in other embodiments of the invention. For example, as an alternative to illumination files, the grid of source points may be specified parametrically in the simulation software.

Still referring to FIG. 14, the method for optimizing an illumination source using isofocal compensation proceeds to step (S4) where separate responses are calculated for each grid source point.

More specifically, each of the separate responses will represent a result or series of results of simulations using the simulation models. Potential responses may include, for example, a critical dimension of the pattern studied or an intensity threshold necessary to define the target CD on the substrate.

After calculation of the separate responses for individual source points, the method then proceeds to step S5 to estimate the variations of the separate responses for individual source points with defocus.

In one embodiment of the invention, this is achieved by a metric that calculates another set of responses for the individual source points at a given defocus. The metric will then compare the responses obtained at defocus with the responses calculated at best focus, and generate a metric-response for each source point. In the event that the response is a critical dimension, the CD obtained at defocus will be subtracted from the CD calculated without defocus, or vice versa. Alternatively, if the response studied is the intensity threshold, the intensity threshold obtained at defocus will be subtracted from the intensity threshold determined without defocus. In doing so, the variation of the CD or the intensity threshold with defocus may be established. The value of the defocus may be set within or outside the range of the depth of focus initially sought. In one embodiment of the invention, the value of the defocus may be within a range from 0.02 to 0.4 $\mu$m.

In order to aid in the optimization of the illumination conditions, the results of the metric can then be visualized by plotting the contour map of the metric-responses as a function of source location.

Figure 15A:
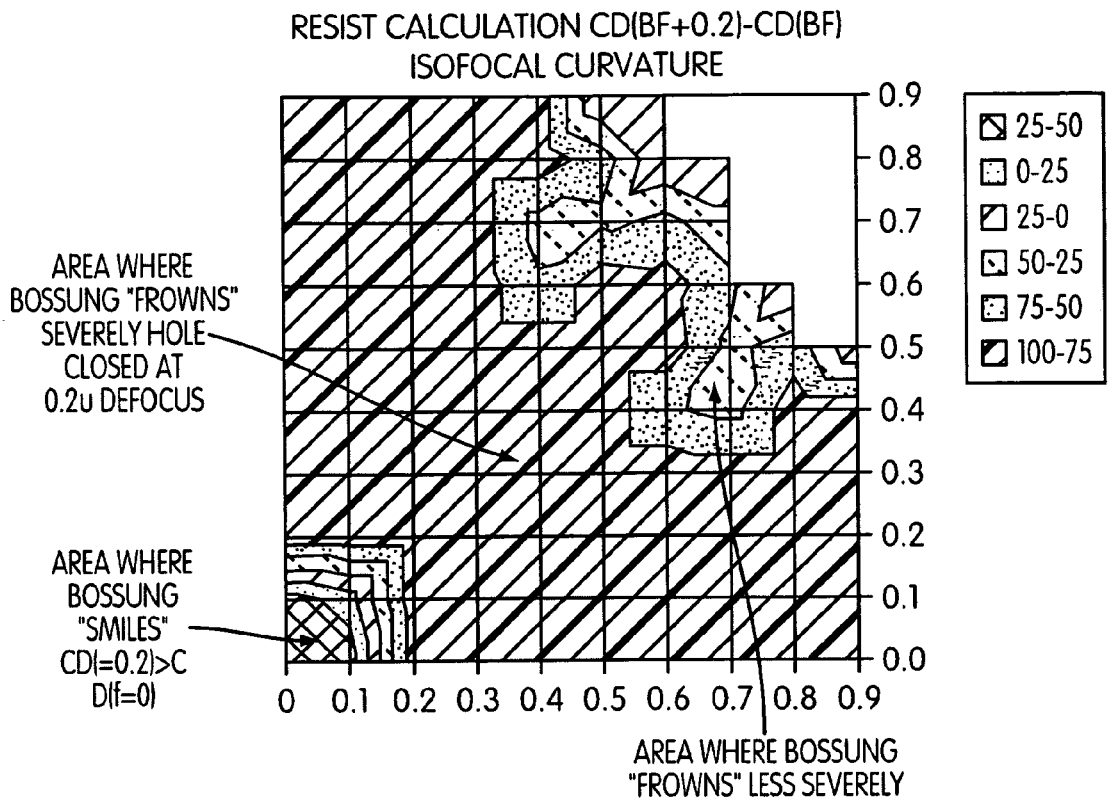
FIGS. 15a and 15b represent isofocal curvature maps obtained with resist calculation and aerial image calculation.
Figure 15B:
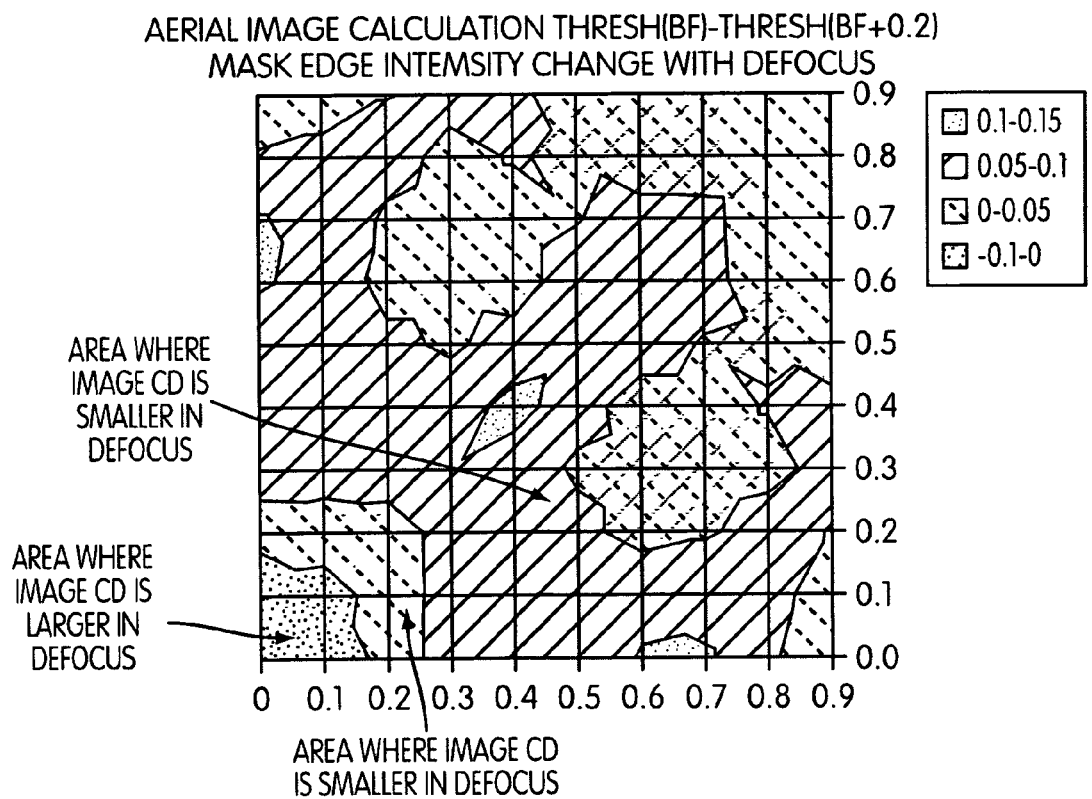

Referring to FIGS. 15*a* and 15*b*, exemplary embodiments of a contour map obtained in accordance with the method of the present invention are provided. FIGS. 15*a–b* correspond to the upper right hand of the illuminator at the pupil plane 18. As can be seen in these figures, the source point grid has a 0.1:0.1 spacing relative to the full aperture of the illuminator. For symmetry reasons, only the upper right hand quadrant of the illuminator need be visualized.

Figure 15C:
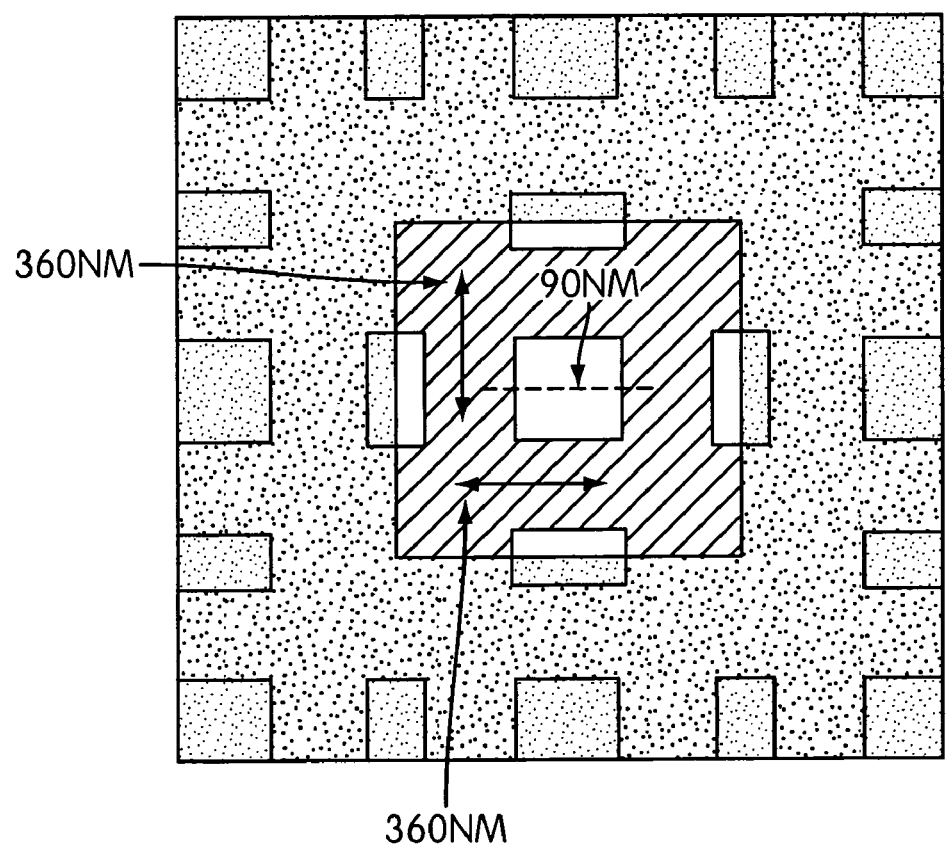
FIG. 15c represents the lithographic problem studied in FIGS. 15a and 15b. It corresponds to a pattern of 90 nm holes in a 360 nm pitch.

The lithographic problem studied was a pattern of 90 nm holes in a 360 nm pitch (See FIG. 15*c*). FIG. 15*a* represents a contour map of the metric-responses obtained with resist calculation. In that case, the metric calculates and compares the critical dimension of the pattern obtained at best focus and defocus. FIG. 15*b* is an example of a contour map, which is obtained with aerial image simulation. In this example, the metric compares the intensity threshold at best focus and the intensity threshold for a 0.2 $\mu$m defocus. In this embodiment, it should be noted that a variation of the threshold intensity in an aerial image simulation is equivalent to a CD variation.

These contour maps indicate the regions of the illuminator that generate an increase or a decrease in the hole CD with defocus, and the magnitude of the size offset. Each area of the illuminator gives a CD change with defocus compared to the CD obtained at best focus. In FIG. 15*a*, the CD variation is calculated in nanometers and in FIG. 15*b*, the intensity threshold variation where an intensity value of 1.0 represents the open frame value.

Referring now in more detail to FIG. 15*a*, the regions of the illuminator producing an augmentation of the CD are concentrated in the extreme bottom left of the quadrant. They reflect a CD augmentation of around 25–50 nm. This corresponds in a Bossung plot to a "smiling" curve. By contrast, the areas of the illuminator creating a diminution of the CD are located in the center of the map. In that case, the curves in the Bossung plot will frown severely and holes will be closed (CD=0) when out of focus.

Similar information may be obtained in the contour map illustrated in FIG. 15*b*. As can be seen in this graph, the areas of the illuminator where an augmentation of the CDs is the most significant are located in the bottom left portion of the quadrant. Conversely, the center of the quadrant will be representative of the region in the illuminator producing a diminution of the intensity threshold and the CD.

Figure 16A:
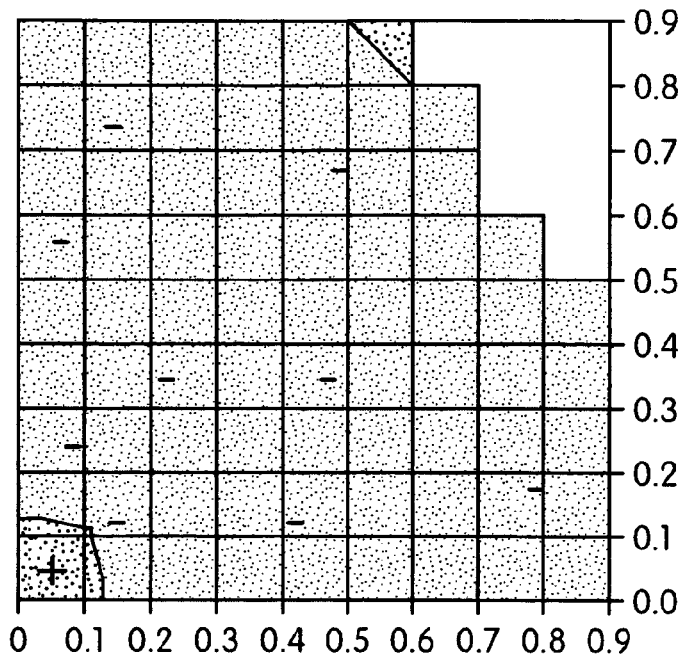
FIGS. 16a and 16b represent isofocal curvature maps obtained with resist calculation and aerial image calculation. These maps illustrate opposite isofocal behaviors within the illuminator.
Figure 16B:
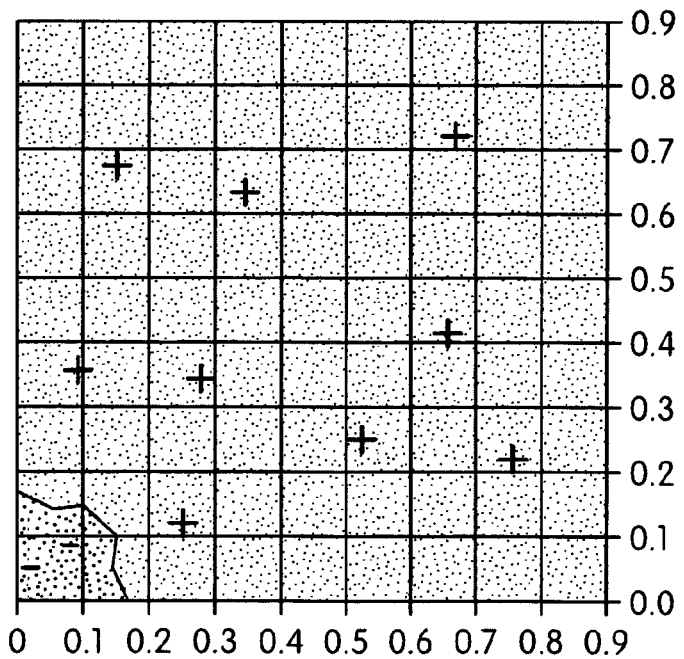

These contour maps may be reduced in one embodiment of the invention to contour maps representing opposite isofocal behaviors, as shown in FIGS. 16*a–b*.

In these maps only two regions are depicted. The first one corresponds to the region of the illuminator creating an augmentation of the CD, which is represented respectively by the positive sign region in the full resist model and the negative sign region in the aerial image calculation. Conversely, the second area corresponds to the region of the illuminator creating a diminution of the CD and is represented by an opposite sign region.

Referring back to FIG. 14, the method for optimizing the illumination conditions using isofocal compensation proceeds to step (S6) where the illumination conditions of the illuminator are adjusted based on the analysis of the metric.

In one embodiment of the invention, the optimization of the illumination conditions is carried out by selecting a type of illumination that combines regions producing an augmentation of the value of the responses (CD or intensity threshold) with regions producing a diminution of the value of the responses. Practically, this means that, in FIG. 16a–b, positive sign regions are balanced with negative sign regions, or vice versa.

Figure 17:
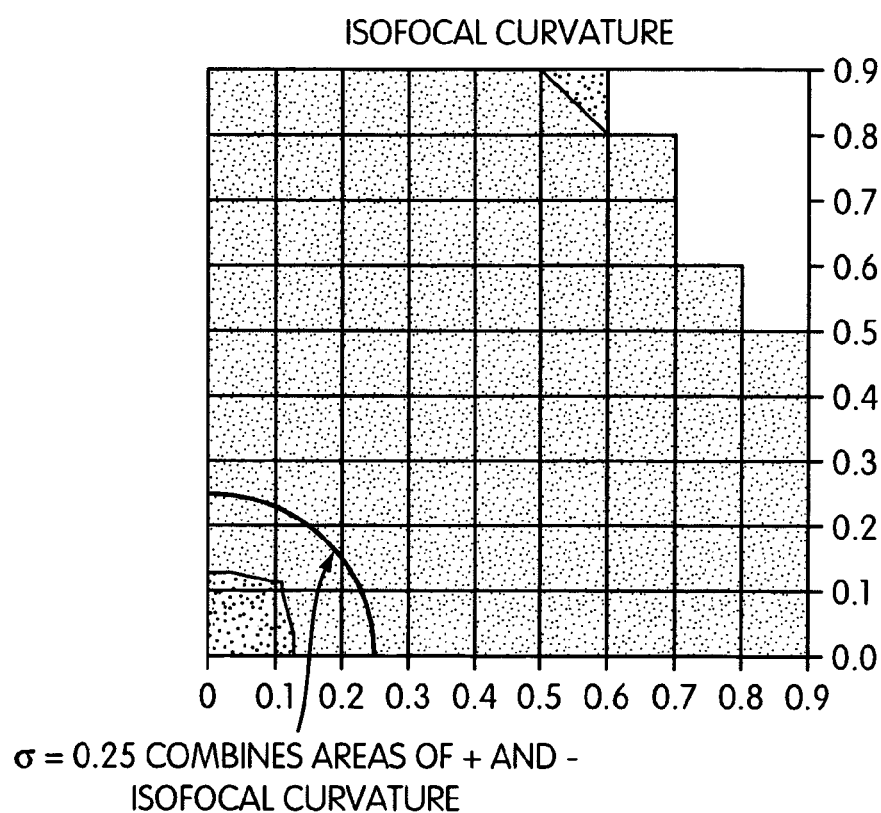
FIG. 17 represents a contour map showing opposite isofocal behavior. This graph indicates what the best illumination arrangement would be for the specific pattern studied (90 nm holes/360 nm pitch)

The balancing of the regions may be done in one embodiment of the invention by selecting some source points in the positive regions and in the negative regions, as shown in FIG. 17. Practically, selection of these source points should take into account the aptitude of these source points to print the target CD. In other words, in this embodiment of the invention, a weight may be attributed to each source point. In the case of an aerial image simulation, the weight of a source point will depend on the intensity of the aerial image obtained from this source point. In the case of a full resist calculation, the weight of a source point will be inversely proportional to the dose required to print the target CD (i.e. CD to size) at best focus. As a result, if the required dose is low for this source point, then that point may potentially counterbalance a relatively larger area in the region of opposite sign. Naturally, if the source points have substantially the same weight, the balancing of the regions is done by selecting an equal number of source points in the positive regions and in the negative region. In FIG. 17, this results in selecting a 0.25-σ illumination arrangement (i.e. the arrangement that defines an aperture corresponding to the arc shown in FIG. 17). In so doing, the lithographic process is rendered substantially isofocal over the range of defocus studied.

Figure 18:
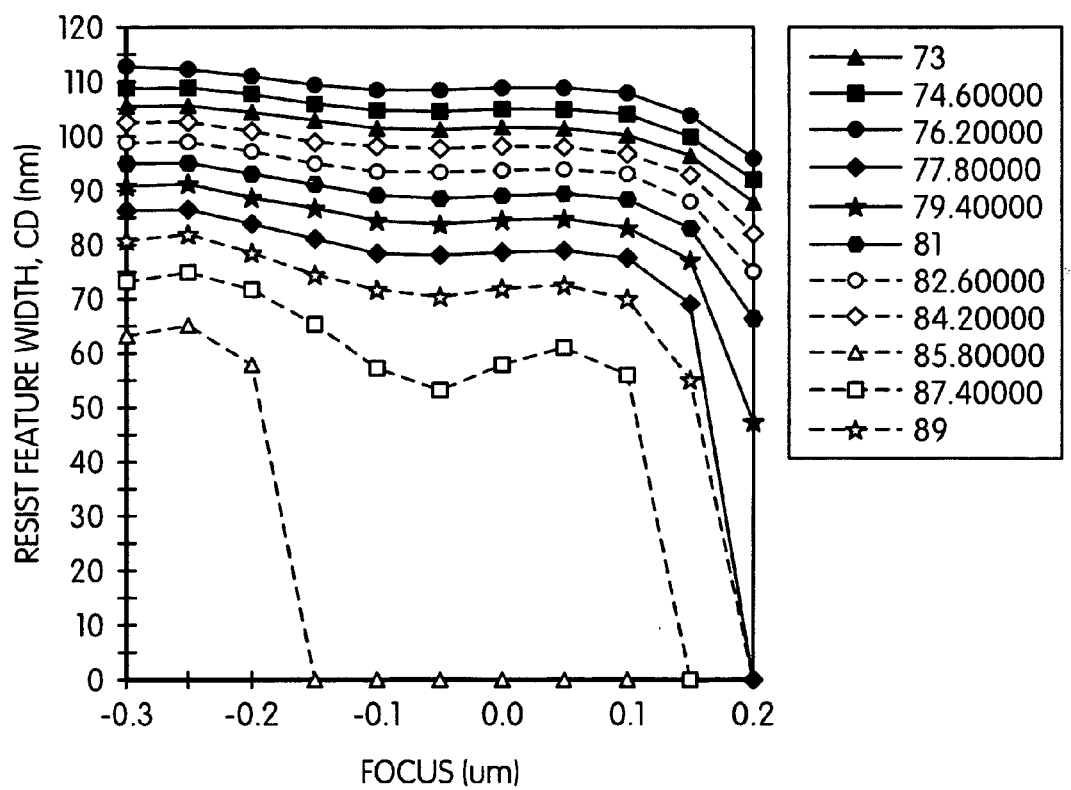
FIG. 18 shows the variation of the CD as a function of defocus for several exposure energies after optimization of the illumination conditions.

Results in terms of CD variation with a 0.25-σ illumination arrangement are shown in FIG. 18. This graph corresponds to a matrix exposure that illustrates the variation of the critical dimension of the 90 nm holes as a function of the focus for several exposures. As can be seen in this graph, there is almost no variation of the CD over the range of focus studied, regardless of the exposure energies.

It should be apparent to one of ordinary skill in the art that supplementary responses may also be taken into account in selecting the best illumination conditions. These responses may comprise in one embodiment of the invention the Exposure Latitude EL, the dose-to-size E1:1, the depth of focus at 8% EL (DOF@8% EL), dense-iso bias, or MEEF.

These responses may carry additional information that may be pertinent in the determination of the optimal arrangement of the illuminator. Calculation of the responses may be based on the same principles set forth in the present invention. That is, separate responses for individual source points may be calculated, each of the responses representing a result of a single or series of simulations using the simulation model. Naturally, simulations for each of these responses may be run with an aerial image model or a full resist calculation.

Figure 19A:
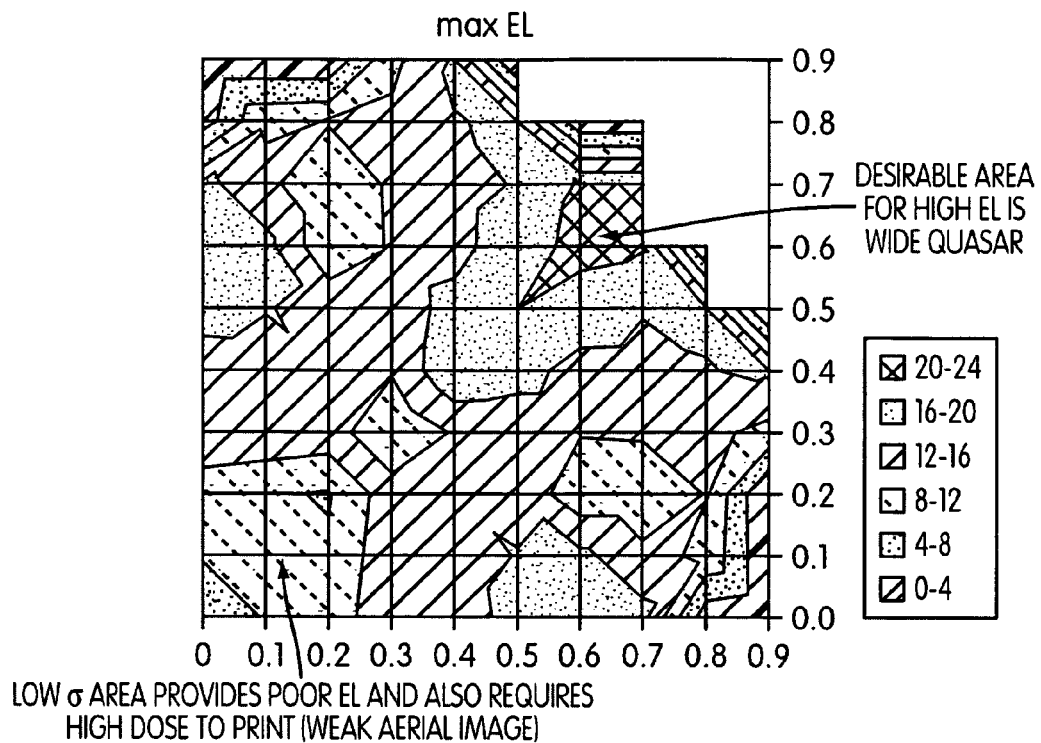
FIG. 19a represents a contour map illustrating the contribution of each source point located in the illuminator to the maximum exposure latitude max-EL.
Figure 19B:
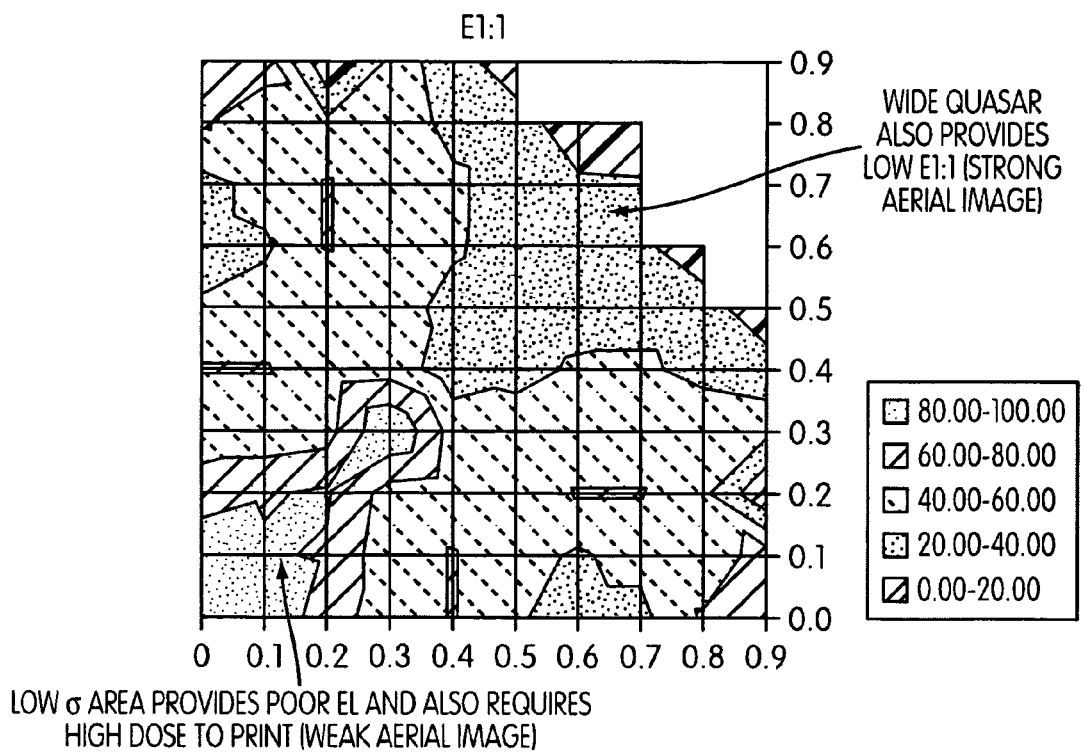
FIG. 19b represents a contour map illustrating the contribution of each source point located in the illuminator to the dose-to-size E1:1.

FIGS. 19a–b illustrate contour maps obtained with a full resist calculation. In the first graph, the response studied is the maximum exposure latitude. In the second graph, the dose-to-size E1:1 response is analyzed. As can be seen in these graphs, different areas of the illuminators give different values for these responses and will contribute to an optimization of the illumination conditions. For example, the areas of the illuminator that will enhance the exposure latitude are located in the upper right portion of the quadrant. Similarly, useful areas that lead to a favorably low E1:1 are also situated in the upper right portion in the contour map.

Figure 20:
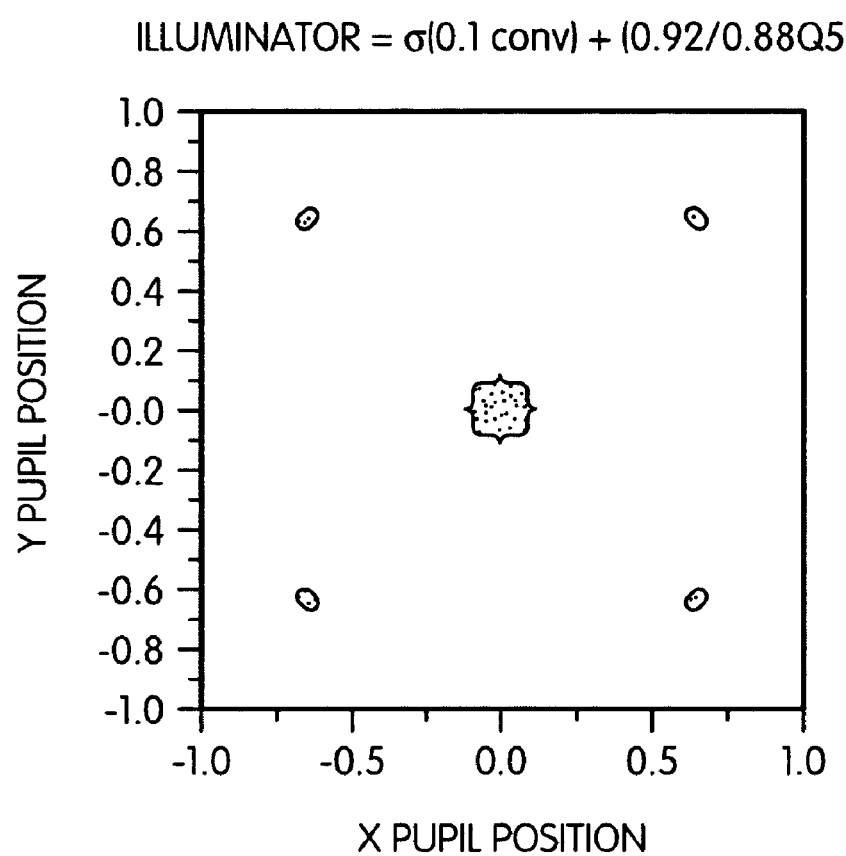
FIG. 20 represents an illumination arrangement at the pupil plane of the illuminator. This arrangement combines information related to isofocal compensation, exposure latitude and dose-to-size.

It is therefore expected that the best illumination conditions to print the 90 nm holes in a 360 nm pitch will be provided by an illumination arrangement as shown in FIG. 20. This figure indicates the profile of the projection beam in the pupil plane of the illuminator. This arrangement combines a on-axis illumination and off-axis quasar illumination.

Figure 21:
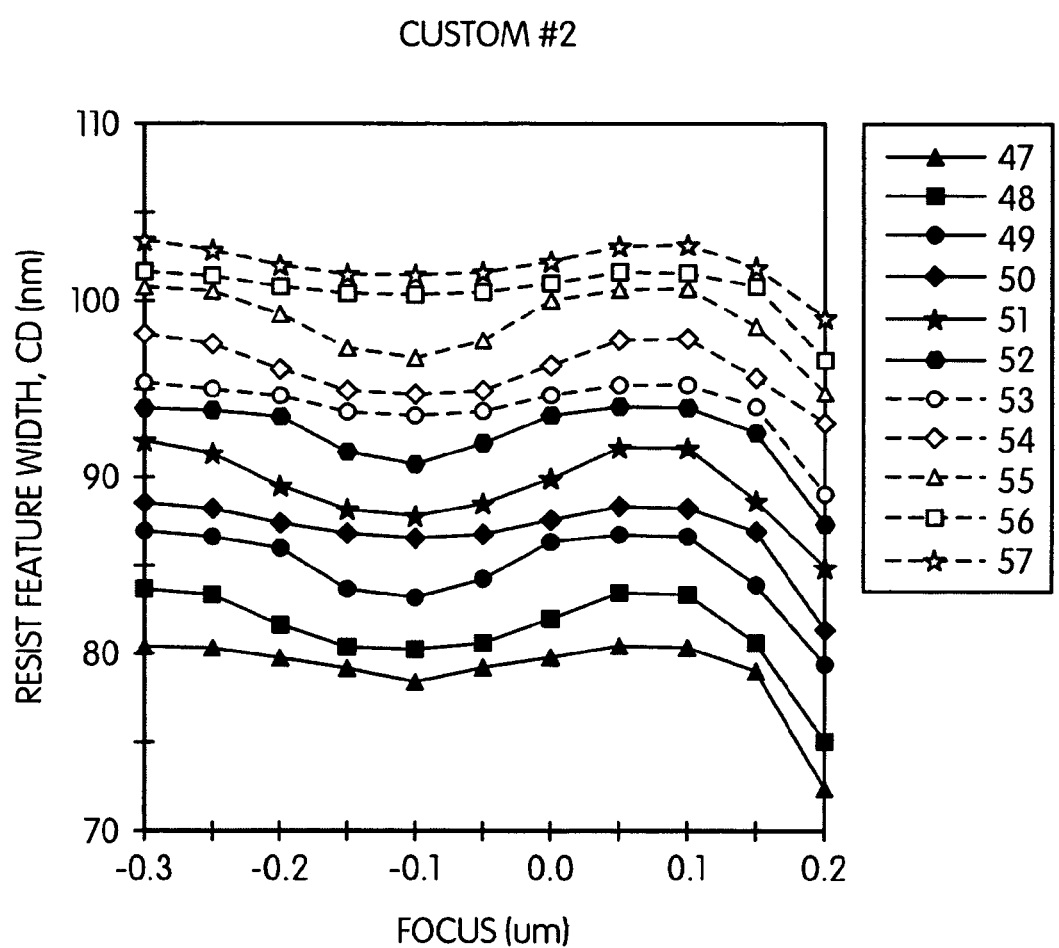
FIG. 21 shows a focus exposure matrix obtained with the illumination arrangement shown in FIG. 20.
Figure 22:
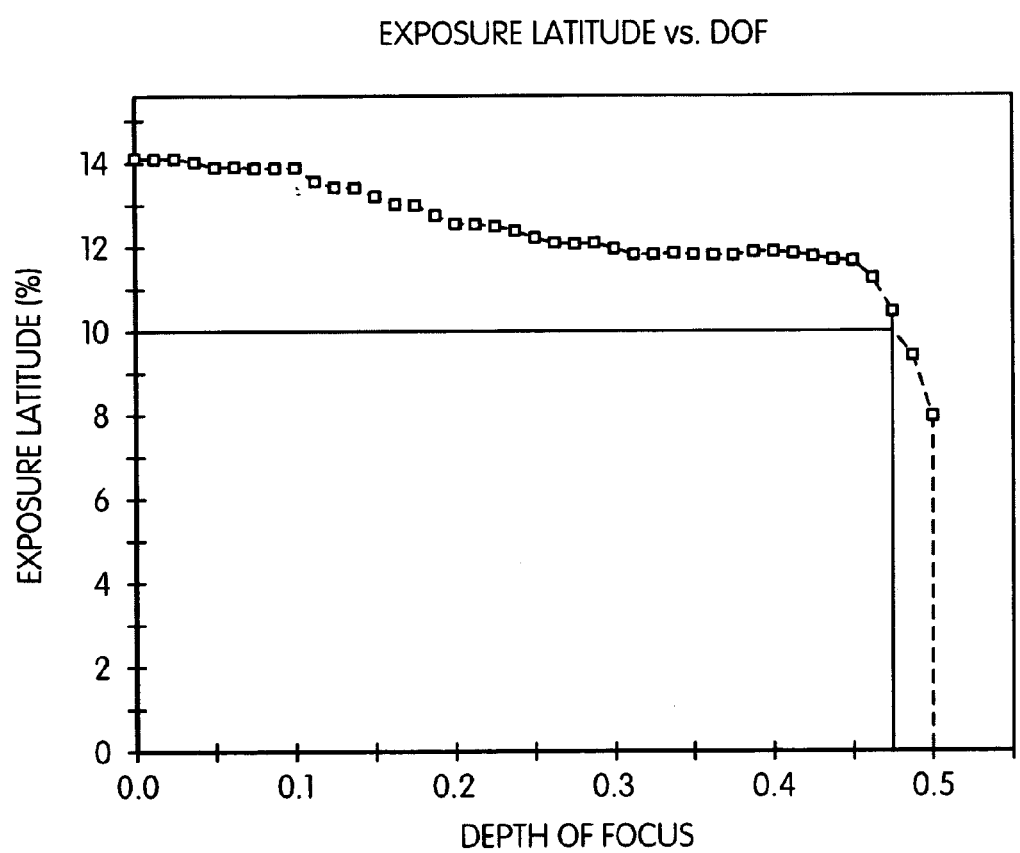
FIG. 22 shows the exposure latitude obtained with the illumination arrangement shown in FIG. 20.

Simulated results in terms of depth of focus and exposure latitude obtained with the illumination arrangement shown in FIG. 20 are provided respectively in FIGS. 21 and 22. As can be seen in these graphs, there is almost no variation of the CD and the exposure latitude through defocus.

Figure 23:
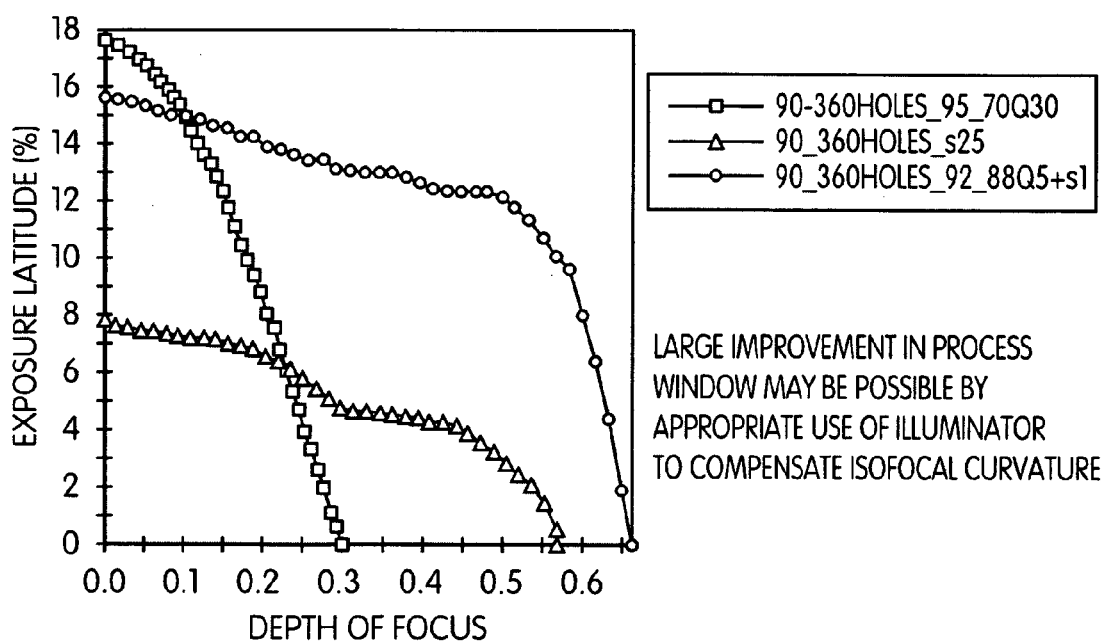
FIG. 23 shows the variation of the exposure latitude with defocus for different illumination conditions.
Figure 24A:
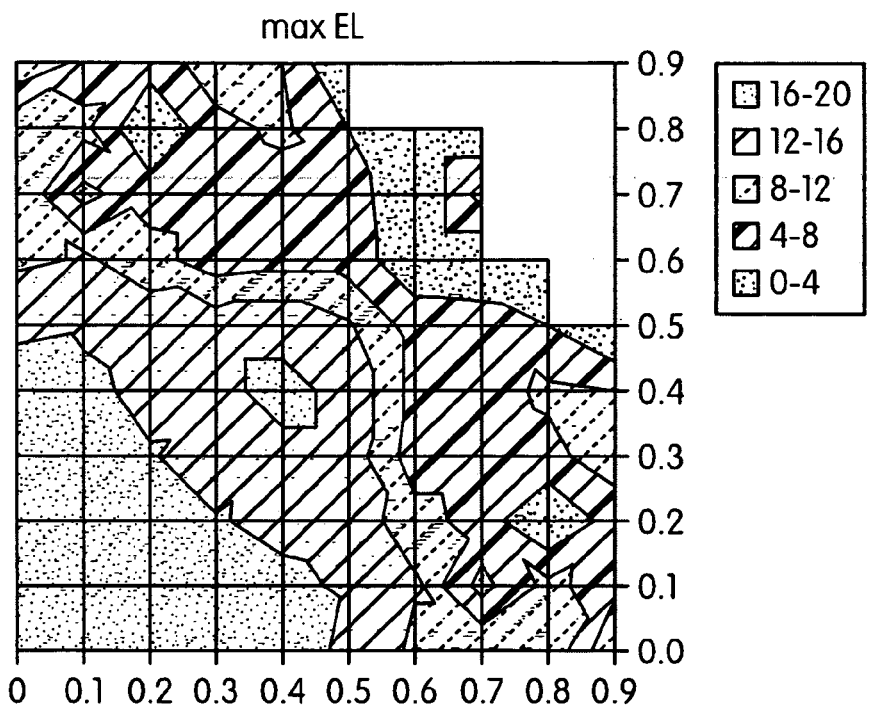
FIGS. 24a–d represent, respectively, simulation results obtained for the exposure latitude, depth of focus, depth of focus at 8% of the exposure latitude and the isofocal curvature. The lithographic pattern corresponds to 75 nm holes located in 400 nm pitch.
Figure 24B:
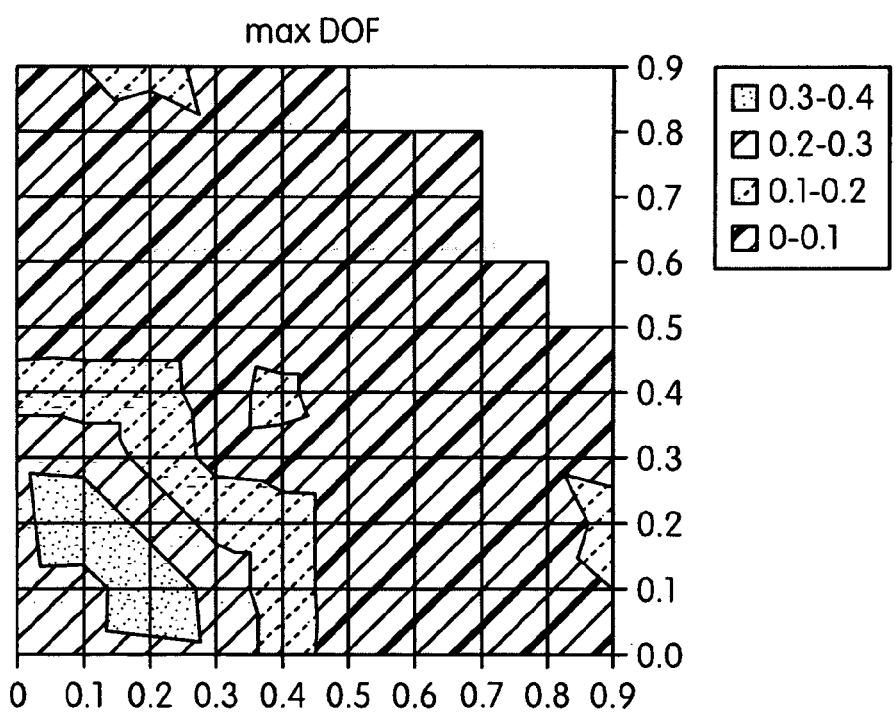
Figure 24C:
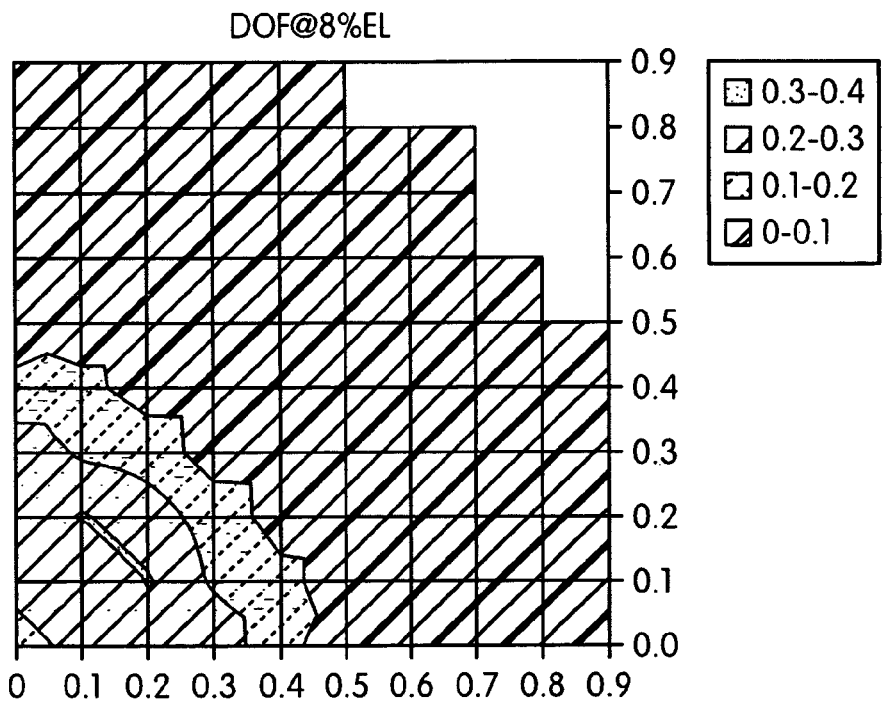
Figure 24D:
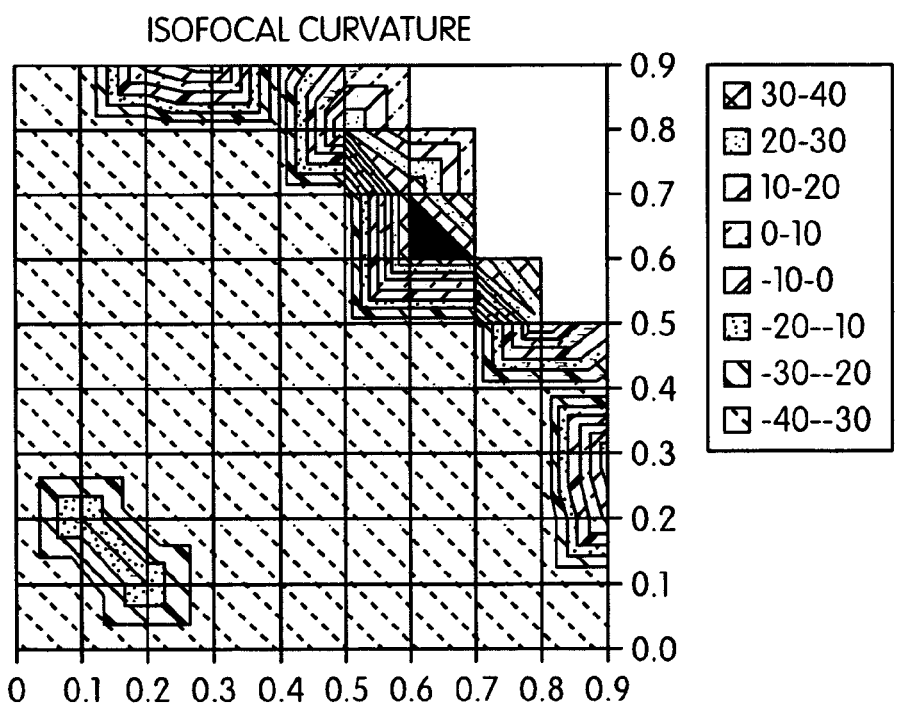

FIG. 23 compares variation of the exposure latitude with defocus for a process optimized with (1) standard calculation (in that case a full resist calculation) which maximizes depth of focus at a fixed dose latitude, (2) isofocal compensation based on a simple illuminator design or (3) isofocal compensation using a complex illuminator and targeting maximum dose latitude. This figure shows that isofocal compensation substantially increases the DOF. This figure also shows that the exposure latitude can be greatly increased while maintaining high DOF by combining appropriate parts of the illuminator. Note that the same enhancement could be obtained by analyzing aerial image calculations including information on the NILS at best focus. Because NILS is proportional to exposure latitude, such an analysis would also lead to a combination of on-axis and off-axis illumination to give isofocal performance with high dose latitude.

A similar approach was used to optimize the illumination conditions for another lithographic problem. Examination of a case where a wide range of contact hole pitches must be printed simultaneously using an attenuated phase shift mask leads to a conclusion that a combination of quasar illumination (for dense pitches) and small sigma (for isolated pitches) gives best results. More careful analysis of one "isolated pitch", in this case, the lithographic pattern studied corresponds to 75 nm holes in a 400 nm pitch illuminated with a 193 nm source under a 1.1 numerical aperture, provides new information. FIGS. 24a–d show simulation results obtained, respectively, for the exposure latitude (max-EL), the depth of focus (max DOF), the depth of focus at 8% of the exposure latitude (DOF@8% EL) and the isofocal curvature.

The first three responses obtained with full resist calculation indicate that a small sigma illumination would be best for this isolated pitch, as expected. By contrast, isofocal curvature simulation shows that addition of a small quasar arrangement at the very edge of the pupil, would add isofocal compensation to the lithographic performance. It was therefore concluded that the best illumination arrangement would extend the quasar plus small sigma illumination beyond that normally needed to print the dense pitches.

Figure 25A:
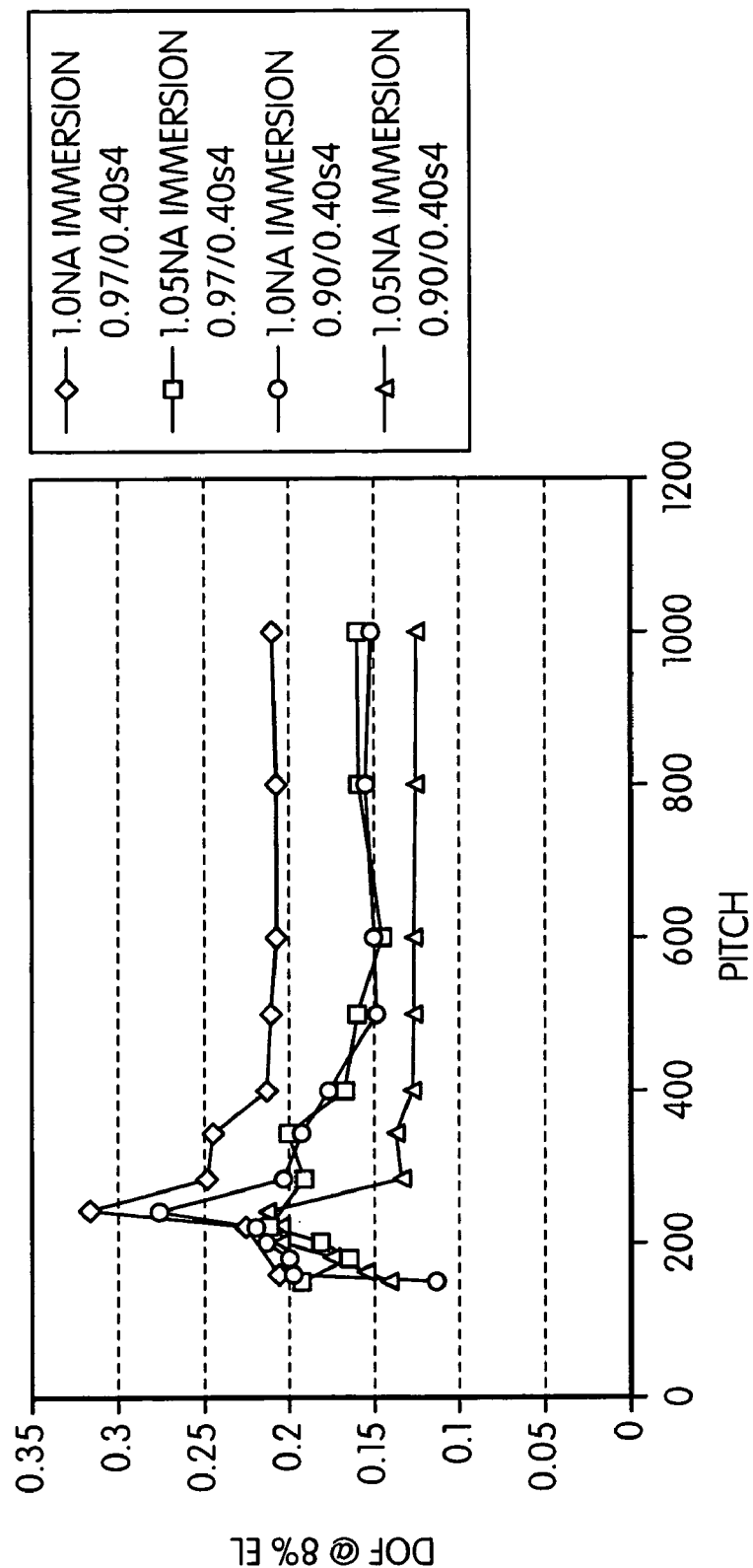
FIG. 25a represents simulation results showing the variation of the depth of focus at 8% of the exposure latitude (DOF@8% EL) as a function of the pitch for different types of illumination arrangement, which are shown in FIGS. 25b and 26c. The lithographic pattern corresponds to 75 nm holes.
Figure 25B:
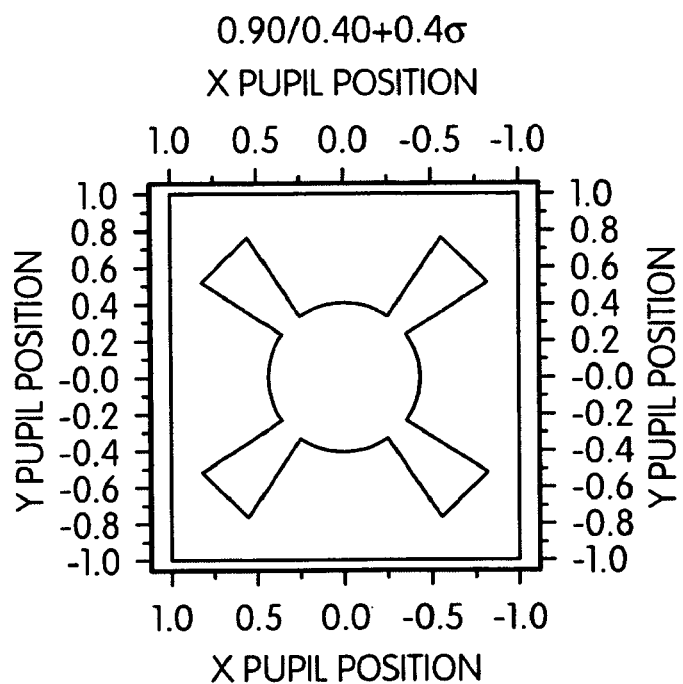
FIG. 25b represents an illumination arrangement at the pupil plane of the illuminator. This arrangement combines information related to isofocal compensation, exposure latitude and dose-to-size. It has a 0.4σ+0.90/0.4 quasar illumination.
Figure 25C:
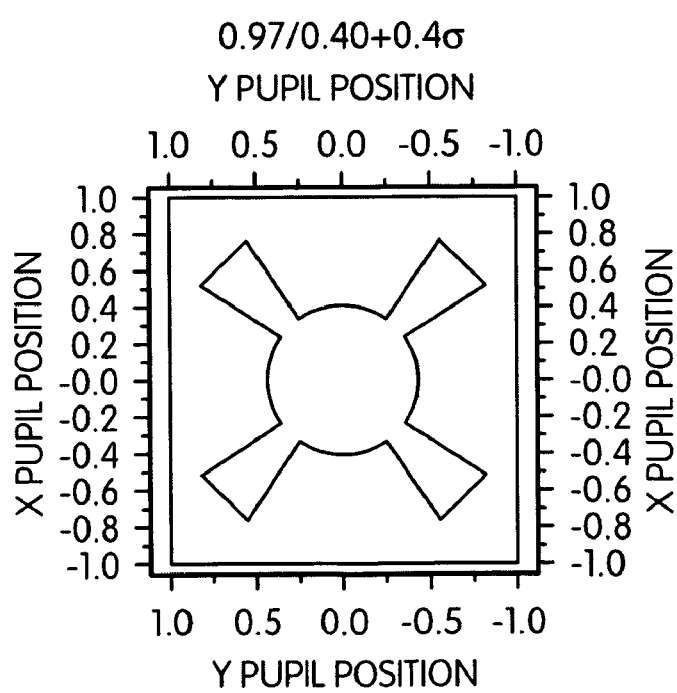
FIG. 25c represents an illumination arrangement at the pupil plane of the illuminator. This arrangement combines information related to isofocal compensation, exposure latitude and dose-to-size. It has a 0.4σ+0.97/0.4 quasar illumination.

Simulated results in terms of depth of focus measured at 8% of the exposure latitude (DOF@8% EL) are illustrated in FIG. 25a for the types of illumination arrangement predicted with the method of the present invention. This graph shows the variation of DOF@8% EL as a function of the pitch. For reference, FIGS. 25b and 25c illustrate the source shape with two types of arrangement (in terms of NA and quasar illumination) at the pupil plane of the illuminator.

As can be seen in this graph, the DOF@8% EL remains stable, regardless of the pitch. More importantly, this figure indicates that a small variation of the quasar illumination may lead to a significant increase in the depth of focus. In that case, isofocal compensation showed that a 0.97 quasar illumination was better than a 0.90 quasar illumination, particularly for the isolated pitches. Simulation of the variation of the DOF@8% EL as a function of pitch clearly corroborates this result. This notable increase in DOF, which could not be predicted with standard calculations, clearly indicates that isofocal compensation calculations are extremely useful to optimize the lithographic process.

While specific embodiments of the invention have been described above, it will be appreciated that the invention may be practiced other than as described. The description is not intended to limit the invention.

What is claimed is:

1. A method for optimizing an illumination condition of a lithographic apparatus by computer simulation using isofocal compensation, the lithographic apparatus comprising an illuminator configured to provide an illumination arrangement, a projection system and a mask having at least one pattern to be printed on a substrate, the method comprising:
    defining a lithographic pattern to be printed on the substrate;
    selecting a simulation model;
    selecting a grid of source points in a pupil plane of the illuminator;
    calculating separate responses for individual source points, each of the responses representing a result of a single or series of simulations using the simulation model;
    calculating a metric representing variation of the separate responses for individual source points with defocus; and
    adjusting an illumination arrangement based on analysis of the metric.

2. A method according to claim 1, wherein calculating the metric comprises:
    applying a defocus;
    calculating separate defocus responses for individual source points at the defocus, each of the defocus responses representing a result of a single or series of simulations using the simulation model; and
    comparing the separate responses with the separate defocus responses for individual source points.

3. A method according to claim 2, wherein the comparing comprises determining separate metric responses for individual source points.

4. A method according to claim 3, wherein the separate metric responses correspond either to an augmentation of the value of the defocus response or a diminution of the value of the defocus response.

5. A method according to claim 3, wherein the determining comprises subtracting the separate defocus responses from the separate responses for individual source points.

6. A method according to claim 3, wherein the adjusting comprises mapping the metric responses as a function of individual source point positions.

7. A method according to claim 4, wherein the adjusting comprises selecting an illumination arrangement capturing source points having opposite metric response behaviors.

8. A method according to claim 1, wherein the defocus is within a range from 0.02 to 0.4 $\mu$m.

9. A method according to claim 1, wherein selecting a simulation model comprises selecting one of a full resist model, an aerial image model, a lumped parameter model and a variable threshold resist model.

10. A method according to claim 9, wherein the resist model is a calibrated model capable of adequately predicting experimental results.

11. A method according to claim 9, wherein the resist model includes defining a resist model taking into account at least one of vector effects, non-zero diffusion of active species, and finite dissolution contrast.

12. A method according to claim 1, wherein the separate responses comprise one of a critical dimension of the pattern and an intensity threshold.

13. A method according to claim 1, wherein the adjusting comprises selecting an illumination arrangement so that the variation of the separate responses is substantially equal to zero through defocus.

14. A method according to claim 1, further comprising calculating other separate responses for individual source points, each of the other responses representing a result of a single or series of simulation using the simulation model.

15. A method according to claim 14, wherein the adjusting comprises adjusting an illumination arrangement based on analysis of the other separate responses.

16. A method according to claim 14, wherein the other responses comprise one of exposure latitude, depth of focus, E1:1, dense to isolated features bias, arbitrary feature biases, sidelobe printing, film loss, sidewall angle, mask error enhancement factor, linear resolution and absolute resolution.

17. A method according to claim 14, further comprising mapping the other separate responses as a function of individual source point positions.

18. A method according to claim 1, further comprising mapping the variation of the separate responses as a function of individual source points positions.

19. A method according to claim 1, wherein a spacing of the source point in the grid is within a range from 0.01 to 0.2.

20. A method according to claim 1, wherein adjusting the illumination arrangement includes adjusting illumination arrangement by varying a position of an axicon/zoom module relative to a pyramidal prism, a position of a diffractive optical element, a position of an aperture blade, or by adjusting a programmable mirror array.

21. A method according to claim 1, wherein adjusting the illumination arrangement includes selecting a multipole illuminator arrangement.

22. A device manufacturing method comprising:
    providing a mask; and
    projecting a patterned beam of radiation onto a target portion of a layer of radiation-sensitive material on a substrate, wherein, prior to impinging the mask, a cross-sectional intensity distribution in the projection beam is optimized using a method according to claim 1.

23. A method according to claim 4, wherein the adjusting comprises weighing the individual source points.

24. A lithographic projection apparatus comprising:
    an illumination system to provide a projection beam of radiation
    a support structure to support patterning structure which can be used to pattern the projection beam according to a desired pattern;
    a substrate table to hold a substrate;
    a projection system to project the patterned beam onto a target portion of the substrate;
    a processor to define a lithographic pattern to be printed on the substrate, to select a grid of source points in a pupil plane of the illumination system, to calculate separate responses for individual source points, each of the responses representing a result of a single or series of simulations using a simulation model, to calculate a metric representing variation of the separate responses for individual source points with defocus; and to calculate an optimized illumination arrangement based on analysis of the metric; and a selectably variable beam controller that is adapted to modify a cross-sectional intensity distribution in the projection beam exiting the illumination system in accordance with the optimized illumination arrangement calculated by the processor.

25. A machine readable medium encoded with machine executable instructions for optimizing an illumination condition of an illuminator using isofocal compensation according to a method comprising:

defining a lithographic pattern to be printed on a substrate;

selecting a simulation model;

selecting a grid of source points in a pupil plane of the illuminator;

calculating separate responses for individual source points, each of the responses representing a result of a single or series of simulations using the simulation model;

calculating a metric representing variation of the separate responses for individual source points with defocus; and adjusting an illumination arrangement based on analysis of the metric.

* * * * *